(12) United States Patent
Kim et al.

(10) Patent No.: US 11,586,331 B2
(45) Date of Patent: Feb. 21, 2023

(54) ELECTRONIC DEVICE

(71) Applicant: SAMSUNG DISPLAY CO., LTD., Yongin-si (KR)

(72) Inventors: Il-Joo Kim, Hwaseong-si (KR); Jeongwoo Kim, Asan-si (KR); Wonjun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/137,602

(22) Filed: Dec. 30, 2020

(65) Prior Publication Data

US 2021/0365155 A1    Nov. 25, 2021

(30) Foreign Application Priority Data

May 22, 2020   (KR) .................. 10-2020-0061698

(51) Int. Cl.
*G06F 3/044* (2006.01)
*G06F 3/041* (2006.01)

(52) U.S. Cl.
CPC .......... *G06F 3/0446* (2019.05); *G06F 3/0412* (2013.01); *G06F 3/0443* (2019.05); *G06F 2203/04111* (2013.01); *G06F 2203/04112* (2013.01)

(58) Field of Classification Search
CPC .... G06F 3/0446; G06F 3/0443; G06F 3/0412; G06F 2203/04111; G06F 2203/04112; G06F 3/0448
See application file for complete search history.

(56) References Cited

U.S. PATENT DOCUMENTS

| | | | |
|---|---|---|---|
| 9,971,467 B2 | 5/2018 | Park et al. | |
| 2011/0310033 A1* | 12/2011 | Liu | G06F 3/0446 345/173 |
| 2012/0229414 A1* | 9/2012 | Ellis | G06F 3/0445 345/174 |
| 2013/0063820 A1* | 3/2013 | Yang | G06F 3/044 359/585 |
| 2013/0278513 A1* | 10/2013 | Jang | G06F 3/0446 345/173 |

(Continued)

FOREIGN PATENT DOCUMENTS

| | | |
|---|---|---|
| KR | 1020180000040 | 1/2018 |
| KR | 1020190044953 | 5/2019 |

(Continued)

*Primary Examiner* — Md Saiful A Siddiqui
(74) *Attorney, Agent, or Firm* — F. Chau & Associates, LLC

(57) ABSTRACT

An electronic device includes a first sensing electrode, a second sensing electrode, a first conductive pattern disposed between the first sensing electrode and the second sensing electrode and including a plurality of first repeating units electrically connected to each other, and a second conductive pattern disposed between the first sensing electrode and the second sensing electrode and including a plurality of second repeating units electrically connected to each other. The first conductive pattern and the second conductive pattern are electrically insulated from each other, and each of the plurality of first repeating units and the plurality of second repeating units includes at least two mesh lines crossing each other.

22 Claims, 19 Drawing Sheets

(56) References Cited

U.S. PATENT DOCUMENTS

| | | | |
|---|---|---|---|
| 2018/0039358 A1* | 2/2018 | Xie | G06F 3/0443 |
| 2018/0348933 A1* | 12/2018 | Jun | G06F 3/0448 |
| 2019/0121474 A1 | 4/2019 | Lee et al. | |
| 2019/0196661 A1 | 6/2019 | Baek et al. | |
| 2020/0089369 A1* | 3/2020 | Bang | G06F 3/0416 |
| 2021/0173525 A1 | 6/2021 | Han et al. | |
| 2021/0200358 A1* | 7/2021 | Kim | G06F 3/0446 |

FOREIGN PATENT DOCUMENTS

| | | |
|---|---|---|
| KR | 1020190076089 | 7/2019 |
| KR | 1020190085319 | 7/2019 |
| KR | 1020200033362 | 3/2020 |

* cited by examiner

FIG. 16
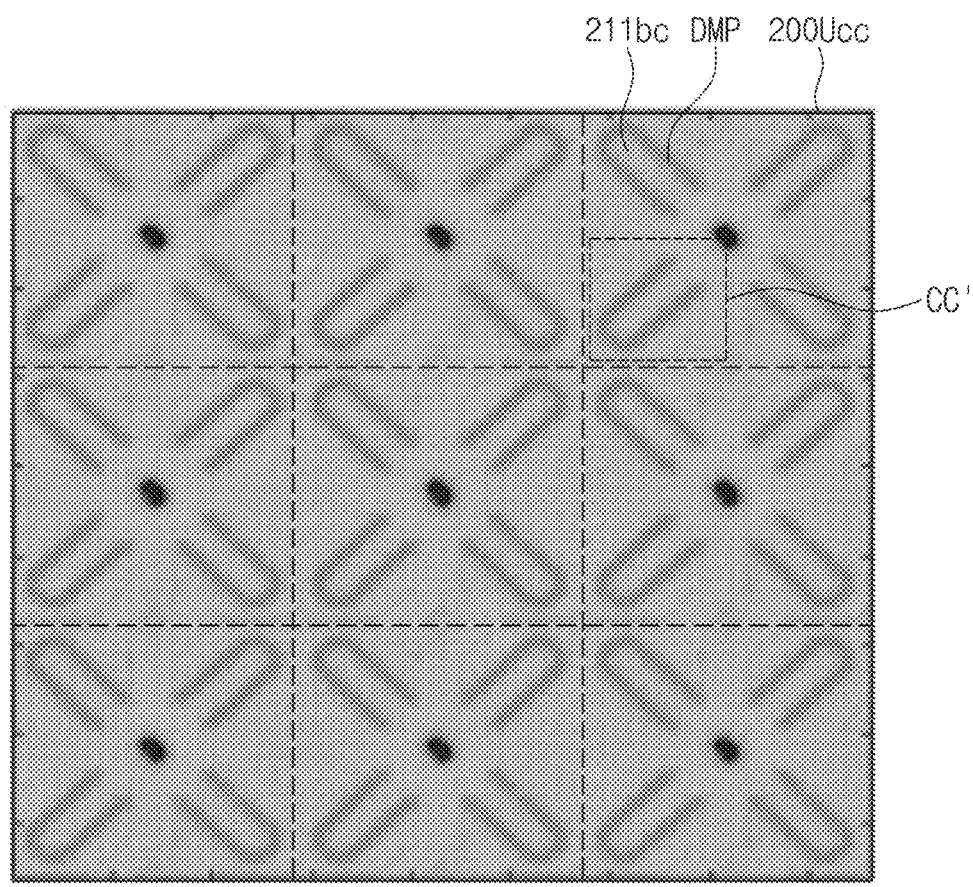
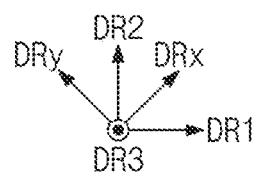

FIG. 18
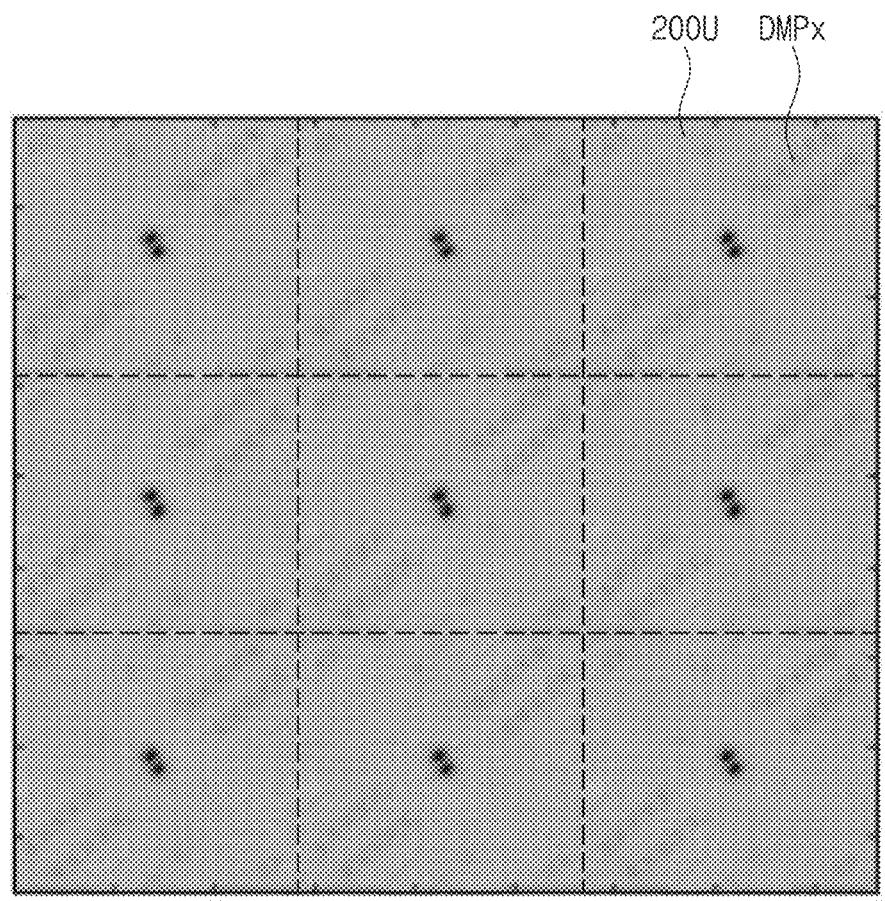
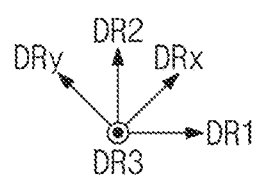

ELECTRONIC DEVICE

CROSS-REFERENCE TO RELATED APPLICATIONS

This application claims priority under 35 U.S.C. § 119 to Korean Patent Application No. 10-2020-0061698, filed on May 22, 2020, the disclosure of which is incorporated by reference herein in its entirety.

TECHNICAL FIELD

Example embodiments of the present inventive concept relate to an electronic device including a sensor layer having a reduced defect rate.

DISCUSSION OF RELATED ART

An electronic device includes an active area that is activated according to an electrical signal. The electronic device detects an input that is applied from an external source through the active area and simultaneously displays various images to provide information to a user.

SUMMARY

Example embodiments of the present inventive concept provide an electronic device including a sensor layer having a reduced defect rate.

An example embodiment of the inventive concept provides an electronic device including a base layer, a first sensing electrode disposed on the base layer, a second sensing electrode disposed on the base layer, a first pattern disposed on the base layer between the first sensing electrode and the second sensing electrode, and including a plurality of first repeating units that are electrically connected to each other, and a second pattern disposed on the base layer between the first sensing electrode and the second sensing electrode, and including a plurality of second repeating units that are electrically connected to each other. The first pattern and the second pattern are electrically insulated from each other, and each of the plurality of first repeating units and the plurality of second repeating units includes two mesh lines crossing each other.

In an example embodiment, each of the plurality of first repeating units and the plurality of second repeating units may further include two mesh lines, and each of the plurality of first repeating units and the plurality of second repeating units may include an opening defined by the four mesh lines.

In an example embodiment, each of the number of the plurality of first repeating units included in the first pattern and the number of the plurality of second repeating units included in the second pattern may range from 9 to 30.

In an example embodiment, the number of the plurality of first repeating units included in the first pattern and the number of the plurality of second repeating units included in the second pattern may be different from each other.

In an example embodiment, the first sensing electrode may include a branch portion extending in a predetermined direction, and the second sensing electrode may have a shape that surrounds a portion of the branch portion, the first pattern may be disposed between the branch portion and the second sensing electrode, and the second pattern may be disposed between the branch portion and the second sensing electrode.

In an example embodiment, the first pattern and the second pattern may be spaced apart from each other with the branch portion disposed therebetween.

In an example embodiment, the number of the plurality of first repeating units included in the first pattern and the number of the plurality of second repeating units included in the second pattern may be the same as each other.

In an example embodiment, the electronic device may further include a third pattern disposed between the branch portion and the second sensing electrode and insulated from the first pattern and the second pattern. The third pattern may face an end of the branch portion in an extension direction of the branch portion.

In an example embodiment, each of the first sensing electrode and the second sensing electrode may have a mesh structure, and each of the first pattern and the second pattern may be electrically floated.

In an example embodiment, the electronic device may further include a display layer disposed below the base layer to provide an image.

In an example embodiment of the inventive concept, an electronic device includes a display layer including an emission area, and a sensor layer which is disposed on the display layer, on which a sensing area and a peripheral area are defined, and which includes a plurality of sensing units disposed on the sensing area. In an example embodiment, each of the plurality of sensing units may include a portion of the first sensing electrode, a portion of the second sensing electrode, a plurality of patterns disposed between the portion of the first sensing electrode and the portion of the second sensing electrode, and a portion of the first sensing electrode may include a plurality of branch portions. In an example embodiment, a portion of the second sensing electrode may include a plurality of sensing patterns spaced apart from each other with the first sensing electrode disposed therebetween and a bridge pattern configured to connect the plurality of sensing patterns to each other. In an example embodiment, the plurality of patterns may include a first pattern disposed between one branch portion of the plurality of branch portions and one sensing pattern of the plurality of sensing patterns, and a second pattern disposed between the one branch portion and the one sensing pattern and electrically insulated from the first pattern.

In an example embodiment, the first pattern may include a plurality of first repeating units, the second pattern may include a plurality of second repeating units, and each of the plurality of first repeating units may have substantially the same shape as each of the plurality of second repeating units.

In an example embodiment, each of the plurality of first repeating units and each of the plurality of second repeating units may include two mesh lines crossing each other.

In an example embodiment, each of the plurality of first repeating units and each of the plurality of second repeating units may include four mesh lines defining one opening.

In an example embodiment, the number of the plurality of first repeating units included in the first pattern and the number of the plurality of second repeating units included in the second pattern may be different from each other.

In an example embodiment, each of the number of the plurality of first repeating units included in the first pattern and the number of the plurality of second repeating units included in the second pattern may range from 9 to 30.

In an example embodiment, the first pattern and the second pattern may be spaced apart from each other with the one branch portion therebetween.

In an example embodiment, the number of the plurality of first repeating units included in the first pattern and the number of the plurality of second repeating units included in the second pattern may be the same as each other.

In an example embodiment, the plurality of patterns may include a third pattern disposed between the one branch portion and the one sensing pattern and insulated from the first pattern and the second pattern. The third pattern may face an end of the one branch portion in an extension direction of the one branch portion.

In an example embodiment, each of the first sensing electrode, the second sensing electrode, and the plurality of patterns may have a mesh shape, and each of the plurality of patterns may be electrically floated.

In an example embodiment, the sensor layer may further include a cover insulating layer configured to cover the first sensing electrode, the second sensing electrode, and the plurality of patterns, and an opening may be defined in a portion of the cover insulating layer, which overlaps the emission area.

In an example embodiment, the electronic device may further include a functional layer disposed on the sensor layer. A portion of the functional layer may be filled into the opening defined by the cover insulating layer, and the functional layer may have a refractive index greater than that of the cover insulating layer.

BRIEF DESCRIPTION OF THE DRAWINGS

The above and other features of the present inventive concept will become more apparent by describing in detail example embodiments thereof with reference to the accompanying drawings, in which:

FIG. 16 is a photograph showing a portion of a sensor layer.

FIG. 18 a photograph showing a portion of a sensor layer.

DETAILED DESCRIPTION

Figure 1:
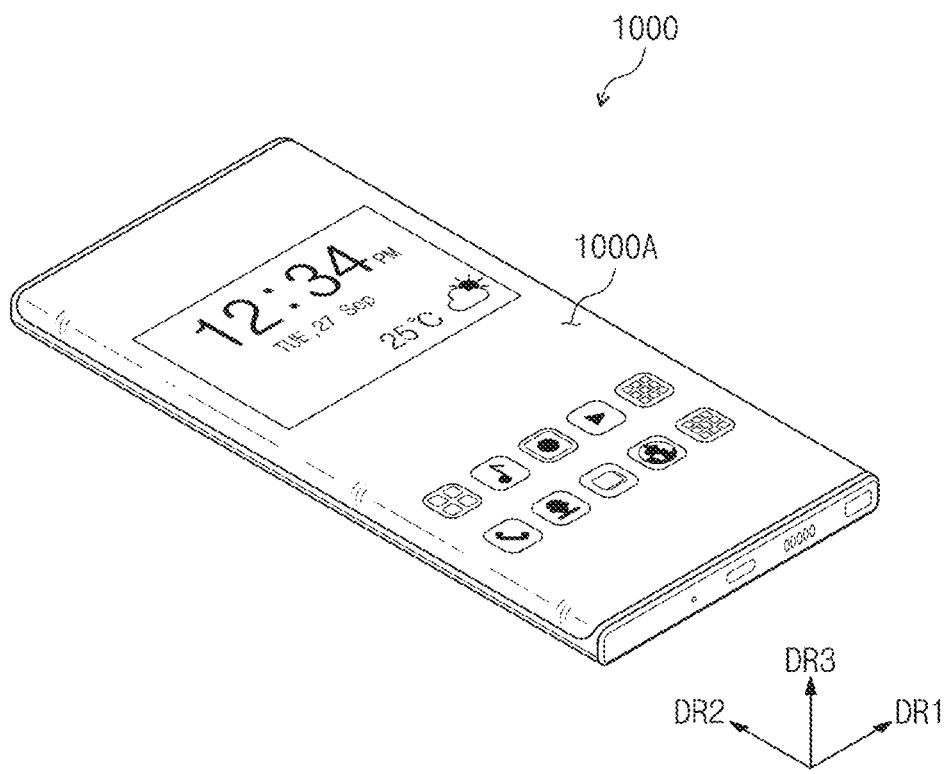
FIG. 1 is a perspective view of an electronic device according to an example embodiment of the inventive concept.

Example embodiments of the present inventive concept will be described more fully hereinafter with reference to the accompanying drawings Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between components should be interpreted in a like fashion.

The term "and/or" includes any and all combinations of one or more of the associated listed items.

It will be understood that the terms "first," "second," "third," etc. are used herein to distinguish one element from another, and the elements are not limited by these terms. Thus, a "first" element in an example embodiment may be described as a "second" element in another example embodiment. In addition, the terms of a singular form may include plural forms unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

The meaning of "include" or "comprise" may specify a property, a fixed number, a step, an operation, an element, a component or a combination thereof, but does not exclude other properties, fixed numbers, steps, operations, elements, components or combinations thereof.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art.

FIG. 1 is a perspective view of an electronic device according to an example embodiment of the inventive concept.

Referring to FIG. 1, an electronic device 1000 may be a device that is activated according to an electrical signal. For example, the electronic device 1000 may be a mobile phone, a tablet PC, a car navigation system, a game console, or a wearable device. However, the electronic device 1000 is not limited thereto. FIG. 1 illustrates an example in which the electronic device 1000 is a mobile phone.

The electronic device 1000 may display an image through an active area 1000A. The active area 1000A may include a plane defined by a first direction DR1 and a second direction DR2. The active area 1000A may further include curved surfaces that are respectively bent from at least two sides of the plane. However, the shape of the active area 1000A is not limited thereto. For example, the active area 1000A may include only the plane. Alternatively, the active area 1000A may further include at least two curved surfaces, for example, four curved surfaces that are respectively bent from four sides.

A thickness direction of the electronic device 1000 may correspond to a third direction DR3 crossing the first direction DR1 and the second direction DR2. Thus, a front surface (or top surface) and a rear surface (or bottom surface) of each of members constituting the electronic device 1000 may be defined based on the third direction DR3.

Figure 2:
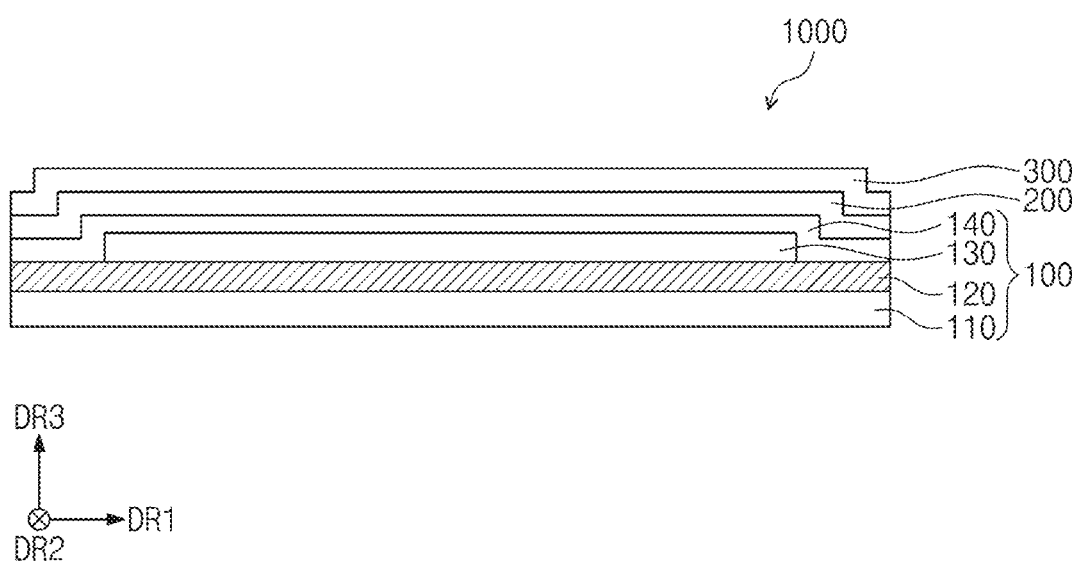
FIG. 2 is a schematic cross-sectional view of an electronic device according to an example embodiment of the inventive concept.

FIG. 2 is a schematic cross-sectional view of an electronic device according to an example embodiment of the inventive concept.

Referring to FIG. 2, the electronic device 1000 may include a display layer 100, a sensor layer 200, and a functional layer 300.

The display layer 100 may generate an image. The display layer 100 may be an emission-type display layer. For example, the display layer 100 may be an organic light emitting display layer, a quantum dot display layer, a micro LED display layer, or a nano LED display layer.

The display layer 100 may include a base layer 110, a circuit layer 120, a light emitting element layer 130, and an encapsulation layer 140.

The base layer 110 may be a member that provides a base surface on which the circuit layer 120 is disposed. The base layer 110 may be, for example, a glass substrate, a metal substrate, or a polymer substrate. However, the inventive concept is not limited thereto. For example, according to example embodiments, the base layer 110 may be an inorganic layer, an organic layer, or a composite layer.

The base layer 110 may have a multilayered structure. For example, the base layer 110 may have a three-layered structure constituted by, for example, a synthetic resin layer, an adhesive layer, and a synthetic resin layer. For example, the synthetic resin layer may include a polyimide-based resin. Also, the synthetic resin layer may include at least one of, for example, an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. However, the synthetic resin layer is not limited thereto.

The circuit layer 120 may be disposed on the base layer 110. The circuit layer 120 may include, for example, an insulating layer, a semiconductor pattern, a conductive pattern, and a signal line. The insulating layer, the semiconductor layer, and the conductive layer may be formed on the base layer 110 in a manner such as, for example, coating or vapor deposition, and then, the insulating layer, the semiconductor layer, and the conductive layer may be selectively patterned through a plurality of photolithography processes. Thereafter, the semiconductor pattern, the conductive pattern, and the signal line included in the circuit layer 120 may be provided.

The light emitting element layer 130 may be disposed on the circuit layer 120. The light emitting element layer 130 may include a light emitting element. For example, the light emitting element layer 130 may include an organic light emitting material, quantum dots, quantum rods, a micro LED, or a nano LED.

The encapsulation layer 140 may be disposed on the light emitting element layer 130. The encapsulation layer 140 may include, for example, an inorganic layer, an organic layers, and an inorganic layer, which are sequentially laminated. However, layers constituting the encapsulation layer 140 are not limited thereto.

The inorganic layers may protect the light emitting element layer 130 against, for example, moisture and oxygen, and the organic layer may protect the light emitting element layer 130 against foreign substances such as, for example, dust particles. The inorganic layers may include, for example, a silicon nitride layer, a silicon oxy nitride layer, a silicon oxide layer, a titanium oxide layer, or an aluminum oxide layer. The organic layer may include, for example, an acrylic-based organic layer. However, the inventive concept is not limited thereto.

The sensor layer 200 may be disposed on the display layer 100. The sensor layer 200 may sense an external input applied from an outside source. The external input may be a user's input. The user's input may include various types of external inputs such as, for example, a portion of user's body, light, heat, a pen, a pressure, etc.

The sensor layer 200 may be disposed on the display layer 100 through a continuous process. In this case, the sensor layer 200 may be expressed as being directly disposed on the display layer 100. Direct disposition may mean that a third component is not disposed between the sensor layer 200 and the display layer 100. For example, according to example embodiments, when the sensor layer 200 is directly disposed on the display layer 100, a separate adhesive member is not disposed between the sensor layer 200 and the display layer 100.

Alternatively, the sensor layer 200 may be bonded to the display layer 100 through an adhesive member. The adhesive member may include, for example, a common adhesive or an adhesive agent.

The functional layer 300 may be disposed on the sensor layer 200. The functional layer 300 may include at least one of an optical path control layer that changes an optical path or an anti-reflection layer that reduces reflectance of external light incident from the outside.

Figure 3:
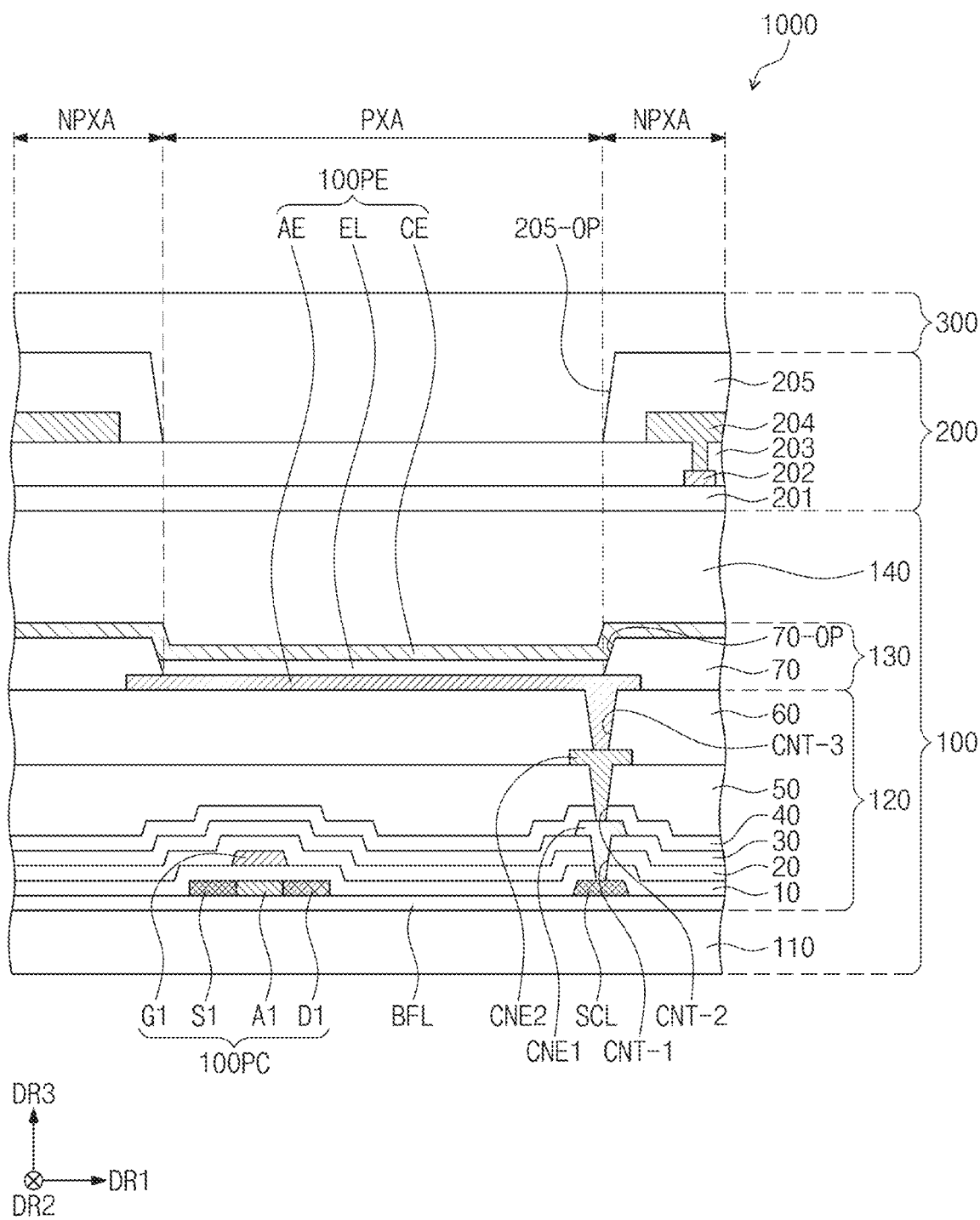
FIG. 3 is a cross-sectional view of an electronic device according to an example embodiment of the inventive concept.

FIG. 3 is a cross-sectional view of an electronic device according to an example embodiment of the inventive concept.

Referring to FIG. 3, in an example embodiment, at least one inorganic layer is disposed on a top surface of the base layer 110. The inorganic layer may include at least one of, for example, aluminum oxide, titanium oxide, silicon oxide silicon oxynitride, zirconium oxide, or hafnium oxide. The inorganic layer may be provided as a multilayer. The multilayered inorganic layer may constitute a barrier layer and/or a buffer layer. In an example embodiment according to FIG. 3, the display layer 100 is illustrated as including a buffer layer BFL.

The buffer layer BFL may improve a bonding force between the base layer 110 and the semiconductor pattern. The buffer layer BFL may include, for example, a silicon oxide layer and a silicon nitride layer, and the silicon oxide layer and the silicon nitride layer may be alternately stacked.

The semiconductor pattern may be disposed on the buffer layer BFL. The semiconductor pattern may include, for example, polysilicon. However, the inventive concept is not limited thereto. For example, the semiconductor pattern may include amorphous silicon or oxide semiconductor.

FIG. 3 illustrates a portion of the semiconductor pattern, and it is to be understood that the semiconductor pattern may be further disposed in other areas. The semiconductor pattern may be arranged in a specific rule over pixels. The semiconductor pattern has different electrical properties depending on whether the semiconductor pattern is doped. The semiconductor pattern may include a first region having high conductivity and a second region having low conductivity. The first region may be doped with an n-type dopant or a p-type dopant. A p-type transistor may include a doped region doped with the p-type dopant, and an n-type transistor may include a doped region doped with the n-type dopant. The second region may be a non-doped region or a region doped with a lower concentration than the first region.

The first region may have a conductivity greater than that of the second region. The first region may substantially act as an electrode or a signal line. The non-doped region may substantially correspond to an active region (or a channel) of the transistor. For example, a portion of the semiconductor pattern may be an active region of the transistor, another portion may be a source or drain of the transistor, and another portion may be a connection electrode or a connection signal line.

Each of the pixels may have an equivalent circuit including, for example, seven transistors, one capacitor, and a light emitting element, and an equivalent circuit diagram of the pixel may be modified in various forms. In FIG. 3, one transistor 100PC and a light emitting element 100PE included in the pixel are exemplarily illustrated.

A source S1, an active region A1, and a drain D1 of the transistor 100PC may be formed from the semiconductor pattern. The source S1 and the drain D1 may extend in opposite directions from the active region A1 in a cross-section. FIG. 3 illustrates a portion of a connection signal line SCL formed from the semiconductor pattern. In an example embodiment, the connection signal line SCL may be connected to the drain D1 of the transistor 100PC on the plane.

A first insulating layer 10 may be disposed on the buffer layer BFL. The first insulating layer 10 commonly overlaps the plurality of pixels and covers the semiconductor pattern. The first insulating layer 10 may include an inorganic layer and/or an organic layer and may have a single-layered or multilayered structure. The first insulating layer 10 may include at least one of, for example, titanium oxide, silicon oxide, silicon oxide nitride, zirconium oxide, or hafnium oxide. In an example embodiment, the first insulating layer 10 may include a single-layered silicon oxide layer. The insulating layer of the circuit layer 120, which will be described further later, as well as the first insulating layer 10, may be an inorganic layer and/or an organic layer and may have a single-layered or a multilayered structure. The inorganic layer may include at least one of the above-described materials, but is not limited thereto.

A gate G1 of the transistor 100PC is disposed on the first insulating layer 10. Each gate G1 may be a portion of a metal pattern. The gate G1 overlaps the active region A1. In the process in which the semiconductor pattern is doped, the gate G1 may function as a mask.

A second insulating layer 20 may be disposed on the first insulating layer 10 and may cover the gate G1. The second insulating layer 20 may commonly overlap the pixels. The second insulating layer 20 may be an inorganic layer and/or an organic layer and may have a single-layered or multilayered structure. In an example embodiment, the second insulating layer 20 may include a single-layered silicon oxide layer.

A third insulating layer 30 may be disposed on the second insulating layer 20. In an example embodiment, the third insulating layer 30 may be a single-layered silicon oxide layer.

A first connection electrode CNE1 may be disposed on the third insulating layer 30. The first connection electrode CNE1 may be connected to the connection signal line SCL through a contact hole CNT-1 passing through the first to third insulating layers 10 to 30.

A fourth insulating layer 40 may be disposed on the third insulating layer 30. The fourth insulating layer 40 may be a single-layered silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

A light emitting element layer 130 including a light emitting element 100PE may be disposed on the circuit layer 120. The light emitting element 100PE may include a first electrode AE, an emission layer EL, and a second electrode CE.

The first electrode AE may be disposed on the sixth insulating layer 60. The first electrode AE may be connected to the second connection electrode CNE2 through a contact hole CNT-3 passing through the sixth insulating layer 60.

A pixel defining layer 70 may be disposed on the sixth insulating layer 60 and may cover a portion of the first electrode AE. An opening 70-OP is defined in the pixel defining layer 70. The opening 70-OP of the pixel defining layer 70 exposes at least a portion of the first electrode AE. In an example embodiment, an emission area PXA may correspond to a portion of an area of the first electrode AE, which is exposed by the opening 70-OP. A non-emission area NPXA may surround the emission area PXA.

The emission layer EL may be disposed on the first electrode AE. The emission layer EL may be disposed in the opening 70-OP. For example, the emission layer EL may be separated from each of the pixels. When the emission layer EL is separated from each of the pixels, each of the emission layers EL may emit light having at least one of a blue, red, or green color. However, the inventive concept is not limited thereto. For example, the emission layer EL may be commonly provided to be connected to the pixels. In this case, the emission layer EL may provide a blue light or a white light.

The second electrode CE may be disposed on the emission layer EL. The second electrode CE may have an integrated shape and may be commonly disposed on the plurality of pixels.

In an example embodiment, a hole control layer may be disposed between the first electrode AE and the emission layer EL. The hole control layer may be commonly disposed in the emission area PXA and the non-emission area NPXA. The hole control layer may include a hole transport layer and may further include a hole injection layer. An electron control layer may be disposed between the emission layer EL and the second electrode CE. The electron control layer may include an electron transport layer and may further include an electron injection layer. The hole control layer and the electron control layer may be commonly formed in the plurality of pixels by using an open mask.

The encapsulation layer 140 may be disposed on the light emitting element layer 130. The encapsulation layer 140 may protect the light emitting element layer 130 against foreign substances such as, for example, moisture, oxygen, and dust particles.

The sensor layer 200 may include a base layer 201, a first conductive layer 202, a sensing insulating layer 203, a second conductive layer 204, and a cover insulating layer 205. The display layer 100 disposed below the base layer 201 of the sensor layer 200.

The base layer 201 may be an inorganic layer including any one of, for example, silicon nitride, silicon oxynitride, and silicon oxide. Alternatively, the base layer 201 may be an organic layer including, for example, an epoxy resin, an acrylic resin, or an imide-based resin. The base layer 201 may have a single-layered structure or a multilayered structure in which a plurality of layers is laminated in the third direction DR3.

Each of the first conductive layer 202 and the second conductive layer 204 may have a single-layered structure or a multilayered structure in which a plurality of layers is laminated in the third direction DR3.

The conductive layer having the single-layered structure may include a metal layer or a transparent conductive layer. The metal layer may include, for example, molybdenum, silver, titanium, copper, aluminum, or an alloy thereof. The transparent conductive layer may include a transparent conductive oxide such as, for example, indium tin oxide (ITO), indium zinc oxide (IZO), zinc oxide (ZnO), indium zinc tin oxide (IZTO), etc. In addition, the transparent conductive layer may include conductive polymers such as, for example, PEDOT, metal nanowires, graphene, etc.

The conductive layer having the multilayered structure may include metal layers. The metal layers may have a three-layered structure of titanium/aluminum/titanium. The conductive layer having the multilayered structure may include at least one metal layer and at least one transparent conductive layer.

The second conductive layer 204 may have a thickness greater than that of the first conductive layer 202. For example, the second conductive layer 204 may have a thickness greater than about 1.5 times that of the first conductive layer 202. For example, the first conductive layer 202 may have a thickness of about 1,950 angstroms, and the second conductive layer 204 may have a thickness of about 3,100 angstroms. However, the inventive concept is not limited thereto. In an example embodiment of the inventive concept, the first conductive layer 202 and the second conductive layer 204 may have substantially the same thickness. Alternatively, the first conductive layer 202 may have a thickness greater than that of the second conductive layer 204.

At least one of the sensing insulating layer 203 or the cover insulating layer 205 may include an inorganic layer. The inorganic layer may include at least one of, for example, aluminum oxide, titanium oxide, silicon oxide, silicon oxynitride, zirconium oxide, or hafnium oxide.

At least one of the sensing insulating layer 203 or the cover insulating layer 205 may include an organic layer. The organic layer may include at least one of, for example, an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

In an example embodiment of the inventive concept, the sensing insulating layer 203 may include an inorganic layer, and the cover insulating layer 205 may include an organic layer. The sensing insulating layer 203 may have a thickness of about 3,000 angstroms, and the cover insulating layer 205 may have a thickness of about 17,500 angstroms to about 25,000 angstroms. However, the thickness of the sensing insulating layer 203 and the thickness of the cover insulating layer 205 are not limited to the above values.

An opening 205-OP may be defined in a portion of the cover insulating layer 205. The opening 205-OP may overlap the emission area PXA. A top surface of the sensing insulating layer 203 may be exposed by the opening 205-OP. The cover insulating layer 205 may cover the first conductive layer 202 and the second conductive layer 204, and thus, may cover a first sensing electrode 210 and a second sensing electrode 220, which are described in detail below.

The functional layer 300 may be disposed on the cover insulating layer 205 and be filled into the opening 205-OP defined in the cover insulating layer 205. Also, the functional layer 300 may provide a substantially flat top surface. The functional layer 300 may have a refractive index greater than that of the cover insulating layer 205. For example, a difference between the refractive index of the functional layer 300 and the refractive index of the cover insulating layer 205 may be about 0.1 or more. The refractive index of the cover insulating layer 205 may range from about 1.4 to about 1.55, and for example, may be about 1.53 in an example embodiment. The refractive index of the functional layer 300 may range from about 1.6 to about 1.75.

The functional layer 300 may include a siloxane-based resin. The functional layer 300 may include at least one of, for example, zirconium oxide particles, aluminum oxide particles, or titanium oxide particles in addition to the siloxane-based resin.

The light provided from the emission layer EL may be emitted in a lateral direction that is inclined with respect to the third direction DR3 as well as in a front direction, for example, the third direction DR3. Light efficiency may be determined based on the light emitted in the front direction. According to an example embodiment of the inventive concept, the light emitted in the lateral direction may be refracted or totally reflected by a difference in refractive index between the side surface of the cover insulating layer 205 defining the opening 205-OP and the functional layer 300. Thus, a light path may be changed in the third direction DR3 or a direction that is close to the third direction DR3. As a result, the light efficiency of the electronic device 1000 may be improved.

In an example embodiment, an anti-reflection layer may be further disposed on the functional layer 300. The anti-reflection layer may include a stretchable synthetic resin film. For example, the anti-reflection layer may be provided by dyeing an iodine compound on a polyvinyl alcohol film (PVA film).

In an example embodiment of the inventive concept, the anti-reflection layer may include color filters. The color filters may have a predetermined arrangement. The arrangement of the color filters may be determined in consideration of emission colors of the pixels included in the display layer 100. Alternatively, the anti-reflection layer may include an offset interference structure. For example, the destructive interference structure may include a first reflection layer and a second reflection layer, which are disposed on layers different from each other. First reflected light and second reflected light, which are respectively reflected from the first reflection layer and the second reflection layer, may destructively interfere, and thus, the external light may be reduced in reflectance.

Figure 4:
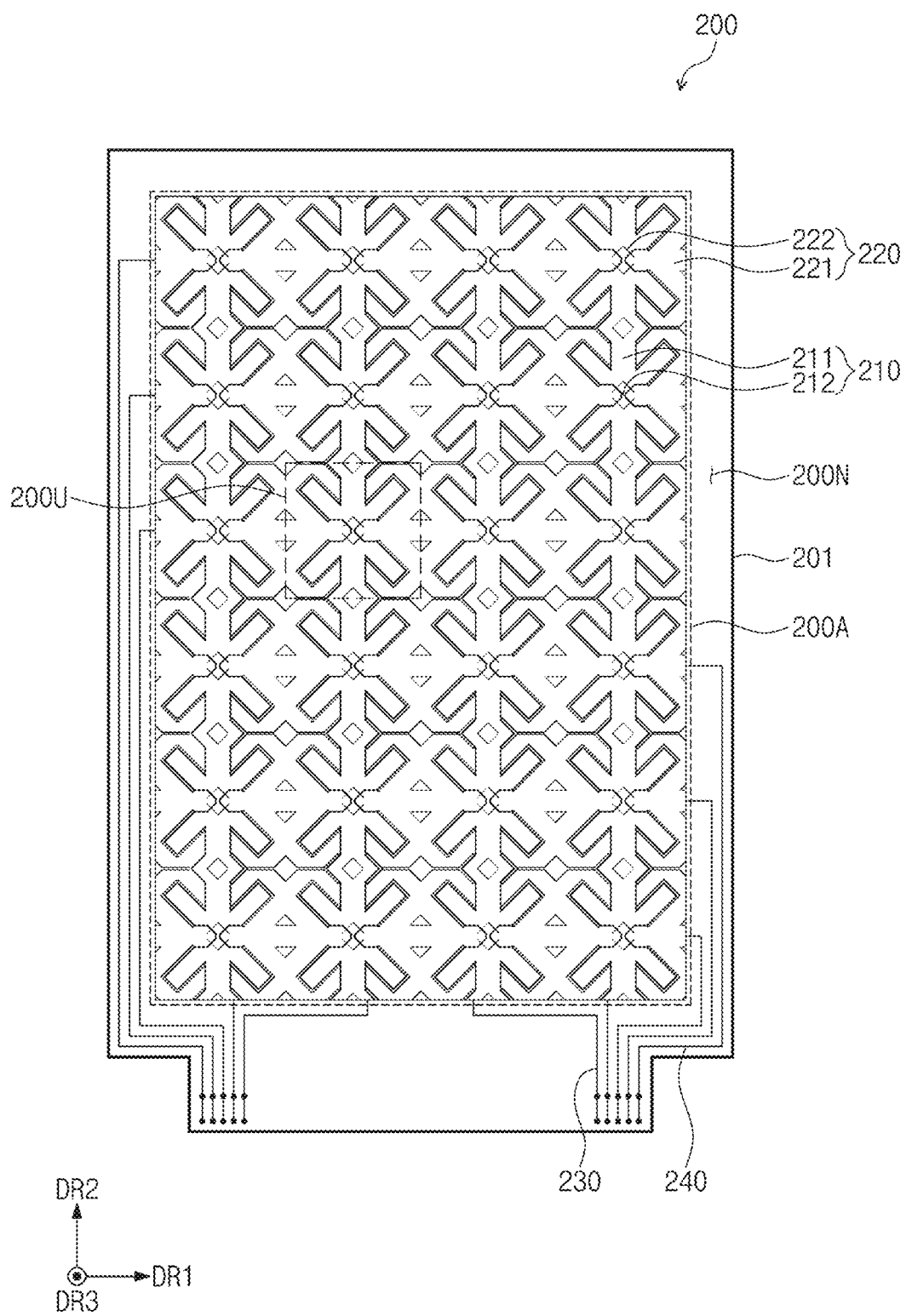
FIG. 4 is a plan view of a sensor layer according to an example embodiment of the inventive concept.

FIG. 4 is a plan view of the sensor layer according to an example embodiment of the inventive concept.

Referring to FIG. 4, the sensor layer 200 may sense an external input applied from an external source. The external input may be a user's input. The user's input may include various types of external inputs such as, for example, a portion of user's body, light, heat, a pen, pressure, etc. The sensor layer 200 may include a sensing area 200A and a peripheral area 200N. The sensing area 200A may be an area that is activated according to an electrical signal. For example, the sensing area 200A may be an area that senses an input. The peripheral area 200N may surround the sensing area 200A.

The sensor layer 200 includes a plurality of first sensing electrodes 210, a plurality of second sensing electrodes 220, a plurality of first sensing lines 230, and a plurality of second sensing lines 240.

The first sensing electrodes 210 and the second sensing electrodes 220 may be disposed in the sensing area 200A. The sensor layer 200 may acquire information about an external input through a variation in capacitance between the first sensing electrodes 210 and the second sensing electrodes 220.

Each of the first sensing electrodes 210 may extend in the second direction DR2. The first sensing electrodes 210 may be spaced apart from each other in the first direction DR1. Each of the second sensing electrodes 220 may extend in the first direction DR1. The second sensing electrodes 220 may be spaced apart from each other in the second direction DR2.

The first sensing electrodes 210 and the second sensing electrodes 220 may cross each other.

Each of the first sensing electrodes 210 may include a plurality of first portions 211 and a second portion 212 disposed between adjacent first portions 211 among the first portions 211. The first portions 211 may be referred to as sensing portions, and the second portion 212 may be referred to as a connection portion or an intersection portion.

The first portions 211 and the second portion 212 may have an integrated shape connected to each other. Thus, the second portion 212 may be defined as a portion of the first sensing electrode 210 crossing the second sensing electrode 220. The first portions 211 and the second portion 212 may be disposed on the same layer as each other.

Each of the second sensing electrodes 220 may include a plurality of sensing patterns 221 and a bridge pattern 222, which is electrically connected to two adjacent sensing patterns 221 among the sensing patterns 221. The sensing patterns 221 and the bridge pattern 222 may be disposed on layers different from each other. In FIG. 4, two bridge patterns 222 connecting the two sensing patterns 221 to each other are illustrated as an example. However, the inventive concept is not limited thereto. For example, according to example embodiments, one bridge pattern 222 or three or more bridge patterns 222 may be provided.

The first portions 211 and the second portion 212 may be disposed on the same layer as the sensing patterns 221. The layer on which the bridge pattern 222 is disposed may be different from the layer on which the first portions 211, the second portion 212, and the sensing patterns 221 are disposed. For example, the bridge pattern 222 may be included in the first conductive layer 202 (see FIG. 3), and the first portions 211, the second portion 212, and the sensing patterns 221 may be included in the second conductive layer 204 (see FIG. 3). However, the disposition of the bridge pattern 222 and the second portion 212 is not limited thereto, and can be varied, as long as the bridge pattern 222 and the second portion 212 are disposed on layers different from each other.

Each of the first sensing electrodes 210 and the second sensing electrodes 220 may be electrically connected to the corresponding sensing lines among the first sensing lines 230 and the second sensing lines 240. For example, one first sensing electrode 210 may be connected to one first sensing line 230, and one second sensing line 240 may be electrically connected to one second sensing electrode 220. However, the connection relationship between the first sensing lines 230 or the second sensing lines 240 with respect to the first sensing electrodes 210 and the second sensing electrodes 220 is not limited to the above-described example. For example, in an example embodiment, one first sensing electrode 210 may be connected to two first sensing lines 230, one first sensing line 230 may be electrically connected to one end of the first sensing electrode 210, and the other first sensing line 230 may be electrically connected to the other end of the first sensing electrode 210.

A portion of one first sensing electrode 210 and a portion of one second sensing electrode 220 may be defined as one sensing unit 200U. Thus, the one sensing unit 200U may also be referred to herein as a sensing electrode unit. The one sensing unit 200U may also be referred to herein as a touch sensing unit. In FIG. 4, one sensing unit 200U is illustrated by a dotted line.

One sensing unit 200U may be partitioned within the sensing area 200A as a unit that is repeated around the bridge pattern 222 and the second portion 212, which cross each other. For example, one sensing unit 200U may be defined as an area on which one first sensing electrode 210 and one second sensing electrode 220 cross each other.

In FIG. 4, a total of 24 sensing units 200U is exemplarily illustrated. However, the inventive concept is not limited thereto. Also, in FIG. 4, all of the sensing units 200U included in the sensor layer 200 are illustrated as having substantially the same shape. However, the inventive concept is not limited thereto. For example, according to example embodiments, a portion of the sensing units 200U and the other portion of the sensing units 200U may have different areas. Alternatively, the number of electrically floated patterns included in a portion of the sensing units 200U and the other portion of the sensing units 200U may be different according to example embodiments.

Figure 5:
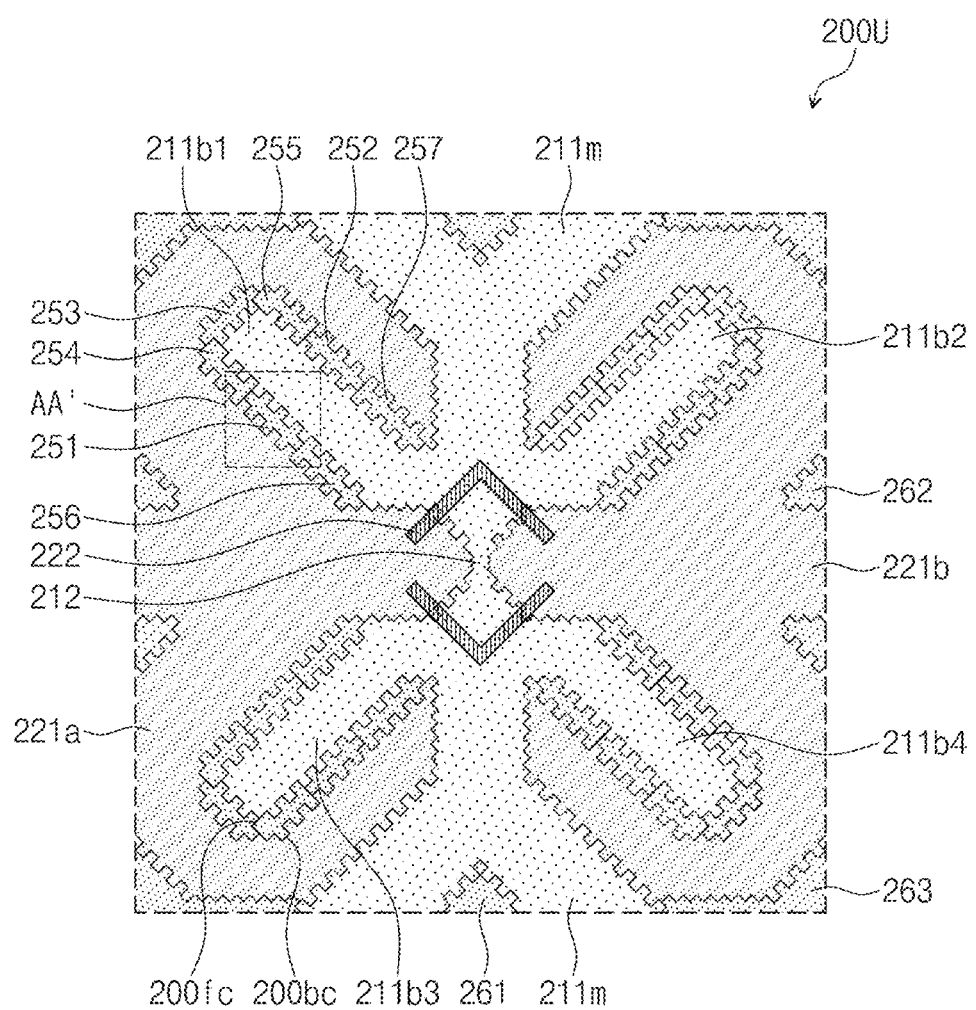
FIG. 5 is a plan view of one sensing unit according to an example embodiment of the inventive concept.

FIG. 5 is a plan view of one sensing unit according to an example embodiment of the inventive concept.

Referring to FIGS. 4 and 5, the sensing unit 200U may include a portion of the first sensing electrode 210, a portion of the second sensing electrode 220, and a plurality of patterns 251, 252, 253, 254, 255, 256, and 257. For example, referring to FIG. 4, one first sensing electrode 210 may be included in six sensing units 200U, and one second sensing electrode 220 may be included in four sensing units 200U. For example, one first sensing electrode 210 may extend in the second direction DR2 such that the one first sensing electrode 210 is included in six sensing units 200U arranged adjacent to one another in the second direction DR2, and one second sensing electrode 220 may extend in the first direction DR1 such that the one second sensing electrode 220 is included in four sensing units 200U arranged adjacent to one another in the first direction DR1. However, the inventive concept is not limited thereto.

A portion of the first sensing electrode 210 may include a plurality of branch portions 211b1, 211b2, 211b3, and 211b4, extension portions 211m, and a second portion 212. The plurality of branch portions 211b1, 211b2, 211b3, and 211b4 and the extension portions 211m may be included in the first portion 211 described above. Each of the extension portions 211m may extend from the second portion 212 in the second direction DR2.

The plurality of branch portions 211b1, 211b2, 211b3, and 211b4 may include a first branch portion 211b1, a second branch portion 211b2, a third branch portion 211b3, and a fourth branch portion 211b4. The first to fourth branch portions 211b1, 211b2, 211b3, and 211b4 may respectively extend from the extension portions 211m in a direction that is away from the bridge pattern 222.

For example, the second branch portion 211b2 and the third branch portion 211b3 may extend in a first crossing direction DRx crossing the first direction DR1 and the second direction DR2. The first branch portion 211b1 and the fourth branch portion 211b4 may extend in a second crossing direction DRy crossing the first direction DR1, the second direction DR2, and the first crossing direction DRx.

A portion of the second sensing electrode 220 may include a plurality of sensing patterns 221a and 221b spaced apart from each other with the first sensing electrode 210 disposed therebetween and a bridge pattern 222 connecting the plurality of sensing patterns 221a and 221b to each other.

The plurality of sensing patterns 221a and 221b may include a first sensing pattern 221a and a second sensing pattern 221b, and the first sensing pattern 221a and the second sensing pattern 221b may be electrically connected to each other by the bridge pattern 222.

Each of the first sensing pattern 221a and the second sensing pattern 221b may surround a portion of the first sensing electrode 210. For example, the first sensing pattern 221a may surround the first branch portion 211b1 and the third branch portion 211b3, and the second sensing pattern 221b may surround the second branch portion 211b2 and the fourth branch portion 211b4.

A plurality of patterns 251, 252, 253, 254, 255, 256, and 257 may be disposed between the first branch portion 211b1 and the first sensing pattern 221a, between the second branch portion 211b2 and the second sensing pattern 221b, between the third branch portion 211b3 and the first sensing pattern 221a, and between the fourth branch portion 211b4 and the second sensing pattern 221b, respectively. The plurality of patterns 251, 252, 253, 254, 255, 256, and 257 may be formed of a conductive material, and thus, may also be referred to herein as conductive patterns.

Hereinafter, a description will be made based on the plurality of patterns 251, 252, 253, 254, 255, 256, and 257 disposed between the first branch portion 211b1 and the first sensing pattern 221a. For convenience of explanation, this description will not be repeated for the remaining branch portions 211b2, 211b3, and 211b4 and the sensing patterns 221a and 221b, and it is to be understood that the following description may be applied to the plurality of patterns 251, 252, 253, 254, 255, 256, and 257 disposed between the remaining branch portions 211b2, 211b3, and 211b4 and the sensing patterns 221a and 221b.

As the plurality of patterns 251, 252, 253, 254, 255, 256, and 257 is provided between the first sensing electrode 210 and the second sensing electrode 220, mutual capacitance between the first sensing electrode 210 and the second sensing electrode 220 may be reduced. However, even if the plurality of patterns 251, 252, 253, 254, 255, 256, and 257 is provided, a variation in mutual capacitance due to an occurrence of a touch event may not be significantly reduced when compared to a variation in mutual capacitance itself. That is, a (variation in mutual capacitance)/(mutual capacitance) value may increase when the plurality of patterns 251, 252, 253, 254, 255, 256, and 257 is provided. In this case, a gain of an amplifier that amplifies a sensing signal may be reduced. As the gain of the amplifier is reduced, a phenomenon in which a ghost touch occurs in a specific situation may be reduced or eliminated. That is, a phenomenon in which a noise signal that is not a signal generated by an actual touch is amplified, and thus, is incorrectly recognized as a touch, may be reduced or eliminated according to example embodiments due to the presence and configuration of the plurality of patterns 251, 252, 253, 254, 255, 256, and 257.

If a temperature increases due to the ghost touch in the specific situation, for example, a touch operation on a partial area of the sensing area 200A at a low temperature, when the entire sensing area 200A is turned on, this may mean that as if the touch occurs even though the touch does not occur on the partial area of the sensing area 200A.

A distance between the first sensing electrode 210 and the second sensing electrode 220 may increase due to the presence of the plurality of patterns 251, 252, 253, 254, 255, 256, and 257. For example, if the plurality of patterns 251, 252, 253, 254, 255, 256, and 257 is not disposed, the distance between the first sensing electrode 210 and the second sensing electrode 220 may be about 4 micrometers to about 5 micrometers. In contrast, if the plurality of patterns 251, 252, 253, 254, 255, 256, and 257 is disposed, the distance between the first sensing electrode 210 and the second sensing electrode 220 may increase to about 72 micrometers. Thus, according to example embodiments that include the plurality of patterns 251, 252, 253, 254, 255, 256, and 257, in the area in which the plurality of patterns 251, 252, 253, 254, 255, 256, is 257 is disposed, the first sensing electrode 210 and the second sensing electrode 220 may be short-circuited only by foreign substances and residues having a size of about 72 micrometers or more. Accordingly, by providing the plurality of patterns 251, 252, 253, 254, 255, 256, and 257 between the first sensing electrode 210 and the second sensing electrode 220, the possibility of the occurrence of a short circuit between the first sensing electrode 210 and the second sensing electrode 220 may be reduced, and thus, the manufacturing yield of the electronic device 1000 (see FIG. 1) may be increased.

Also, according to an example embodiment of the inventive concept, the plurality of patterns 251, 252, 253, 254, 255, 256, and 257 may be electrically insulated from each other. The sizes of the plurality of patterns 251, 252, 253, 254, 255, 256, and 257 may be determined in consideration of mutual capacitance and pattern visibility for each sensing unit 200U. A detailed description related to this configuration will be described later.

In FIG. 5, seven patterns 251, 252, 253, 254, 255, 256, and 257 are illustrated as an example. However, the inventive concept is not limited thereto. For example, the plurality of patterns 251, 252, 253, 254, 255, 256, and 257 may also be provided as two to six patterns or more than seven patterns.

According to an example embodiment of the inventive concept, as the plurality of patterns 251, 252, 253, 254, 255, 256, and 257 provided between the first sensing electrode 210 and the second sensing electrode 220 is provided, a variation in mutual capacitance between the first sensing electrode 210 and the second sensing electrode 220 may not be large even though some of the plurality of patterns 251, 252, 253, 254, 255, 256, and 257 are electrically connected to the first sensing electrode 210 or the second sensing electrode 220. Accordingly, a defect rate of the sensor layer 200 may be reduced, and thus, the manufacturing yield of the electronic device 1000 (see FIG. 1) may be increased.

Also, even though the first sensing electrode 210 or the second sensing electrode 220 of a portion of the sensing units 200U may be electrically connected to a portion of the plurality of patterns 251, 252, 253, 254, 255, 256, and 257, a variation in sensing sensitivity may be below a predetermined level, and thus, in a state in which the patterns 251, 252, 253, 254, 255, 256, and 257 are electrically insulated from each other, an electronic device 1000 (see FIG. 1) having uniform sensing sensitivity compared to a case in which the patterns 251, 252, 253, 254, 255, 256, and 257 are electrically connected to each other may be provided. For example, according to example embodiments, by electrically insulating the patterns 251, 252, 253, 254, 255, 256, and 257 from each other, if some but not all of the patterns 251, 252, 253, 254, 255, 256, and 257 are electrically connected to the first sensing electrode 210 or the second sensing electrode 220, the remaining of patterns 251, 252, 253, 254, 255, 256, and 257 do not also become electrically connected to the first sensing electrode 210 or the second sensing electrode 220, which may reduce a defect rate of the sensor layer 200 and increase the manufacturing yield of the electronic device 1000 (see FIG. 1).

The plurality of patterns 251, 252, 253, 254, 255, 256, and 257 may be referred to as first to seventh patterns 251, 252, 253, 254, 255, 256, and 257. The first pattern 251 and the second pattern 252 may be spaced apart from each other with the first branch portion 211*b*1 disposed therebetween. The third pattern 253 may face an end of the first branch portion 211*b*1. The end of the first branch portion 211*b*1 may mean an end of the first branch portion 211*b*1 in the extending direction, for example, in the second crossing direction DRy of the first branch portion 211*b*1.

The fourth pattern 254 may be disposed between the first pattern 251 and the third pattern 253, and the fifth pattern 255 may be disposed between the second pattern 252 and the third pattern 253. The fourth pattern 254 and the fifth pattern 255 may be spaced apart from each other with the first branch portion 211*b*1 disposed therebetween. The sixth pattern 256 may be spaced apart from the fourth pattern 254 with the first pattern 251 disposed therebetween, and the seventh pattern 257 may be spaced apart from the fifth pattern 255 with the second pattern 252 disposed therebetween. The sixth pattern 256 and the seventh pattern 257 may be spaced apart from each other with the first branch portion 211*b*1 disposed therebetween.

The sensing unit 200U may further include first to third dummy patterns 261, 262, and 263. The first dummy pattern 261 may be defined in the first portion 211 and be surrounded by the extension portion 211*m*. The second dummy pattern 262 may be defined in each of the first and second sensing patterns 221*a* and 221*b* and may be surrounded by the first and second sensing patterns 221*a* and 221*b*. The third dummy pattern 263 may be defined between two second sensing electrodes 220 adjacent to each other.

In an example embodiment, each of the first to third dummy patterns 261, 262, and 263 is not a pattern disposed at a boundary between the first sensing electrode 210 and the second sensing electrode 220. Thus, even if the first to third dummy patterns 261, 262, and 263 are electrically connected to the first sensing electrode 210 or the second sensing electrode 220, which is disposed therearound, a variation in mutual capacitance between the first sensing electrode 210 and the second sensing electrode 220 may be negligible, for example, less than about 0.1%.

Each of the first to seventh patterns 251, 252, 253, 254, 255, 256, and 257 and each of the first to third dummy patterns 261, 262, and 263 may be electrically floated patterns.

Figure 6A:
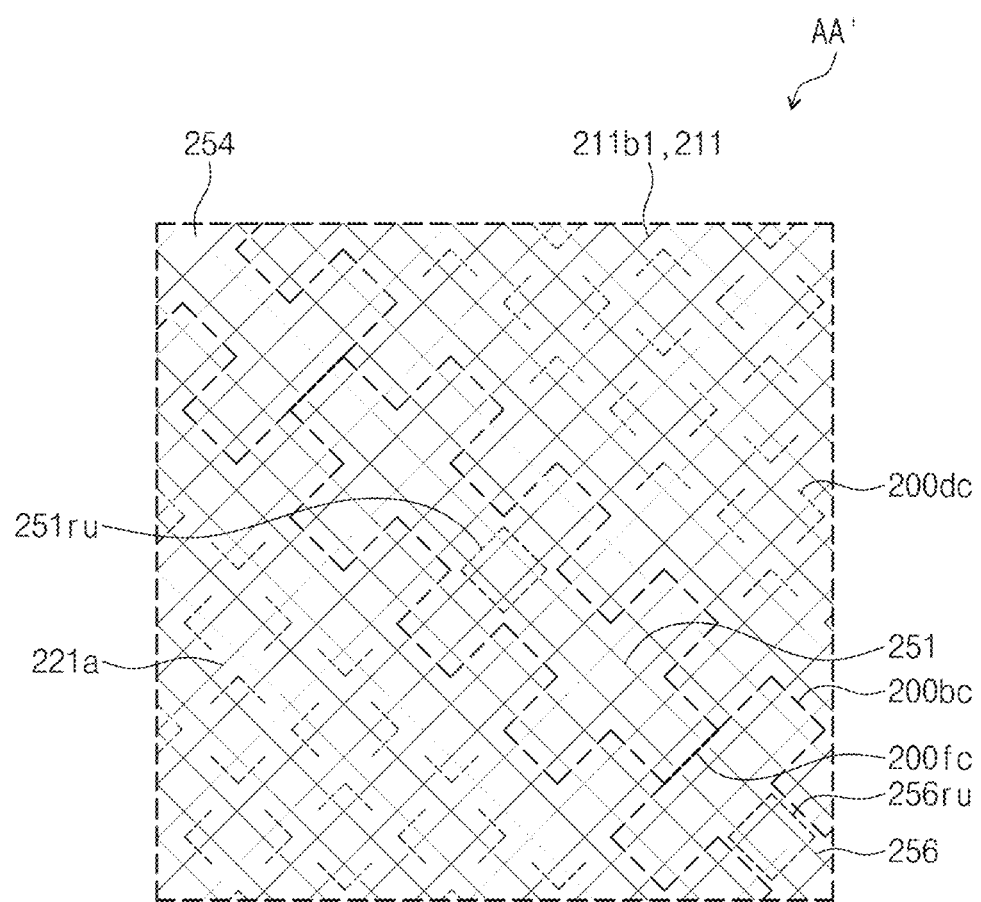
FIG. 6A is an enlarged view of an area AA' of FIG. 5 according to an example embodiment of the inventive concept.
Figure 6B:
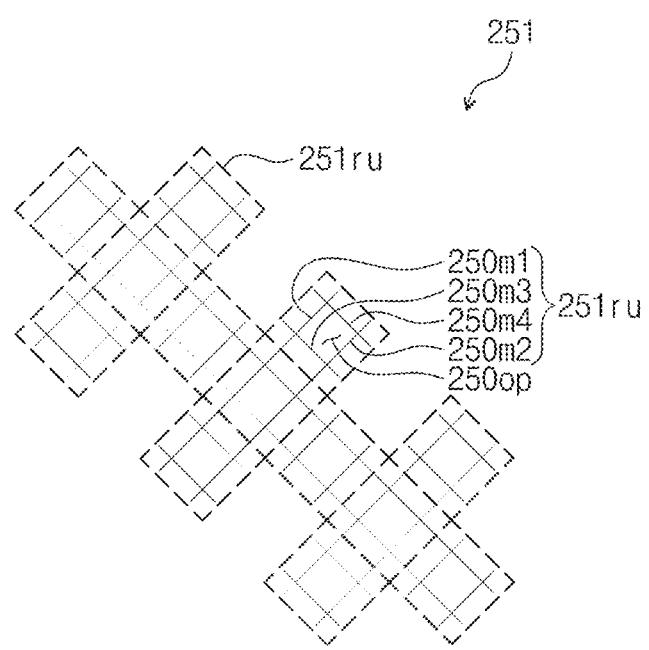
FIG. 6B is a plan view of a first pattern of FIG. 6A.

FIG. 6A is an enlarged view of an area AA' of FIG. 5 according to an example embodiment of the inventive concept. FIG. 6B is a plan view of a first pattern of FIG. 6A.

Referring to FIGS. 4, 5, and 6A, the first sensing electrode 210, the second sensing electrode 220, the first to seventh patterns 251, 252, 253, 254, 255, 256, and 257, and the first to third dummy patterns 261, 262, and 263 may have a mesh structure. An opening defined in the mesh structure may overlap the emission area PXA described with reference to FIG. 3.

FIG. 6A illustrates a portion of a first sensing pattern 221*a*, a portion of a first branch portion 211*b*1, a first pattern 251, a portion of a fourth pattern 254, and a portion of a sixth pattern 256.

In an example embodiment, mesh lines are not disposed on dotted lines 200*bc*, 200*fc*, and 200*dc* illustrated in FIG. 6A. The dotted lines 200*bc*, 200*fc*, and 200*dc* may be defined as a first boundary 200*bc*, a second boundary 200*fc*, and a disconnected portion 200*dc*. For example, the first boundary 200*bc* may distinguish the first sensing pattern 221*a* from the first to the seventh patterns 251, 252, 253, 254, 255, 256, and 257 and may distinguish the first branch portion 211*b*1 from the first to seventh patterns 251, 252, 253, 254, 255, 256, and 257. The second boundary 200*fc* may be a boundary by which the first to seventh patterns 251, 252, 253, 254, 255, 256 and 257 are distinguished from each other. The disconnected portion 200*dc* may be provided at the first branch portion 211*b*1 and the first sensing pattern 221a so that the first boundary 200bc and the second boundary 200fc are not visible to a user.

The first pattern 251 may include a plurality of first repeating units 251ru. The second to seventh patterns 252, 253, 254, 255, 256, and 257 may include second to seventh repeating units having substantially the same shape as the first repeating unit 251ru, respectively. For example, the sixth repeating unit 256ru included in the sixth pattern 256 may have substantially the same shape as the first repeating unit 251ru. The first repeating units 251ru refer to repeating portions of the first pattern 251 that form the first pattern 251, and may also be referred to herein as first repeating pattern portions. Similarly, the second to seventh repeating units corresponding to the second to seventh patterns 252, 253, 254, 255, 256, and 257 refer to repeating portions forming the second to seventh patterns 252, 253, 254, 255, 256, and 257, respectively, and may also be referred to herein as second to seventh repeating pattern portions. As described above, the first to seventh patterns 251, 252, 253, 254, 255, 256, and 257 may be formed of a conductive material and may be referred to as conductive patterns. Thus, the repeating units respectively forming the first to seventh patterns 251, 252, 253, 254, 255, 256, and 257 may also be referred to as repeating conductive units or repeating conductive pattern portions.

Referring to FIG. 6B, the first pattern 251 may include a total of 13 first repeating units 251ru. However, the inventive concept is not limited thereto. For example, in an example embodiment, the first pattern 251 may include a total of between at least 9 and at most 30 first repeating units 251ru, and the repeating units of the second to seventh patterns 252, 253, 254, 255, 256, and 257 may also include a total of between at least 9 and at most 30 repeating units. That is, the number of the repeating units respectively forming each of the first to seventh patterns 251, 252, 253, 254, 255, 256, and 257 may be equal to or greater than 9 and equal to or less than 30. The first repeating units 251ru included in the first pattern 251 may be electrically connected to each other.

The first repeating unit 251ru may include the plurality of mesh lines. For example, the first repeating unit 251ru may include a first mesh line 250m1, a second mesh line 250m2, a third mesh line 250m3, and a fourth mesh line 250m4. The first mesh line 250m1 and the second mesh line 250m2 may extend in the first crossing direction DRx, and the third mesh line 250m3 and the fourth mesh line 250m4 may extend in the second crossing direction DRy. The first mesh line 250m1 may cross each of the third mesh line 250m3 and the fourth mesh line 250m4, and the second mesh line 250m2 may cross each of the third mesh line 250m3 and the fourth mesh line 250m4. One opening 250op may be defined by the first to fourth mesh lines 250m1, 250m2, 250m3, and 250m4. The opening 250op may overlap the emission area PXA (see FIG. 3).

Referring again to FIG. 5, the second pattern 252 may have substantially the same shape and size as the first pattern 251. Thus, the second pattern 252 may include 13 second repeating units. In addition, the third pattern 253 may include 13 third repeating units, the fourth pattern 254 may include 13 fourth repeating units, the fifth pattern 255 may include 13 fifth repeating units, the sixth pattern 256 may include 16 sixth repeating units, and the seventh pattern 257 may include 16 seventh repeating units. However, the inventive concept is not limited thereto.

For example, the number of repeating units constituting each of the first to seventh patterns 251, 252, 253, 254, 255, 256, and 257 is not limited to the above-described example as long as the number of repeating units is provided within a predetermined range. Also, FIGS. 5 and 6A illustrate an example in which the first to seventh patterns 251, 252, 253, 254, 255, 256, and 257 are partitioned in a symmetrical shape with respect to the first branch portion 211b1. However, the inventive concept is not limited thereto. For example, the first pattern 251 and the second pattern 252 may have sizes different from each other. Thus, the number of repeating units included in the first pattern 251 and the number of repeating units included in the second pattern 252 may be different from each other.

Figure 7A:
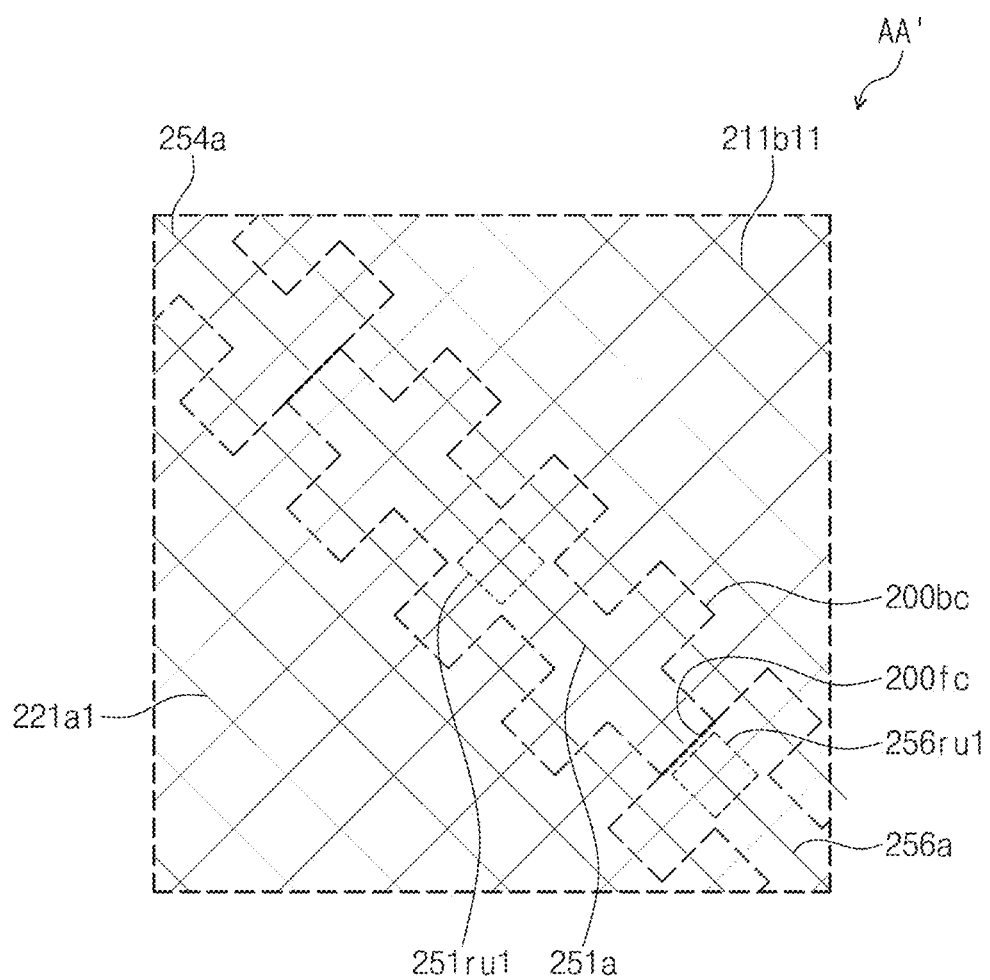
FIG. 7A is an enlarged view of the area AA' of FIG. 5 according to an example embodiment of the inventive concept.
Figure 7B:
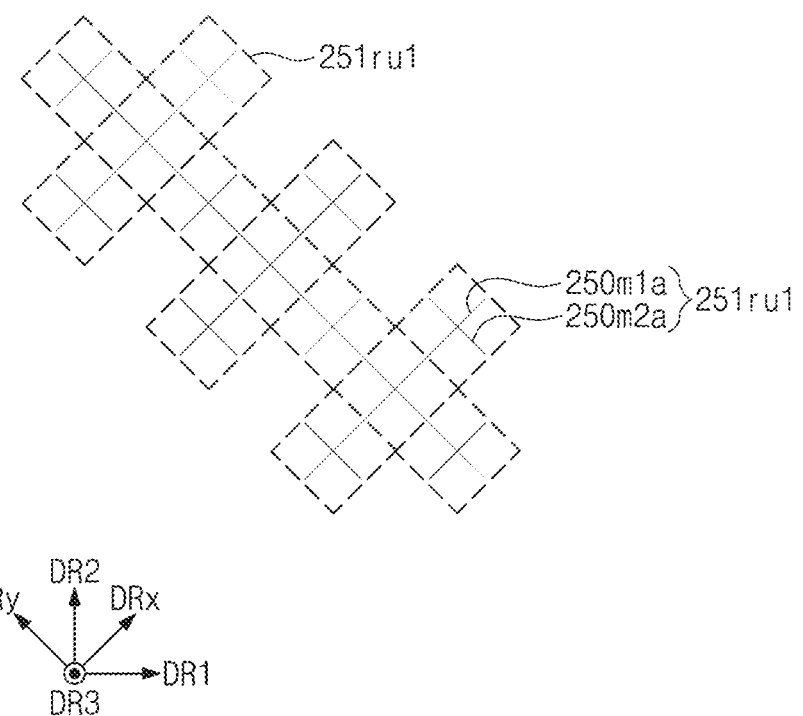
FIG. 7B is a plan view of a first pattern of FIG. 7A.

FIG. 7A is an enlarged view of the area AA' of FIG. 5 according to an example embodiment of the inventive concept. FIG. 7B is a plan view of a first pattern of FIG. 7A.

FIG. 7A illustrates a portion of a first sensing pattern 221a1, a portion of a first branch portion 211b11, a first pattern 251a, a portion of a fourth pattern 254a, and a portion of a sixth pattern 256a.

Referring to FIGS. 7A and 7B, a first pattern 251a may include a plurality of first repeating units 251ru1. The sixth pattern 256a may include a plurality of sixth repeating units 256ru1. Each of the first repeating units 251ru1 and each of the sixth repeating units 256ru1 may be substantially the same shape as each other.

One first repeating unit 251ru1 and three first repeating units 251ru1 arranged in the first crossing direction DRx may be alternately arranged in the second crossing direction DRy to form the first pattern 251a.

The first repeating unit 251ru1 may include a plurality of mesh lines. For example, the first repeating unit 251ru1 may include a first mesh line 250m1a and a second mesh line 250m2a, which cross each other. The first mesh line 250m1a may extend in the first crossing direction DRx, and the second mesh line 250m2a may extend in the second crossing direction DRy.

The 13 first repeating units 251ru1 included in the first pattern 251a may be electrically connected to each other. The first repeating unit 251ru1 included in the first pattern 251a may be electrically insulated from the sixth repeating unit 256ru1 included in the sixth pattern 256a.

Figure 8:
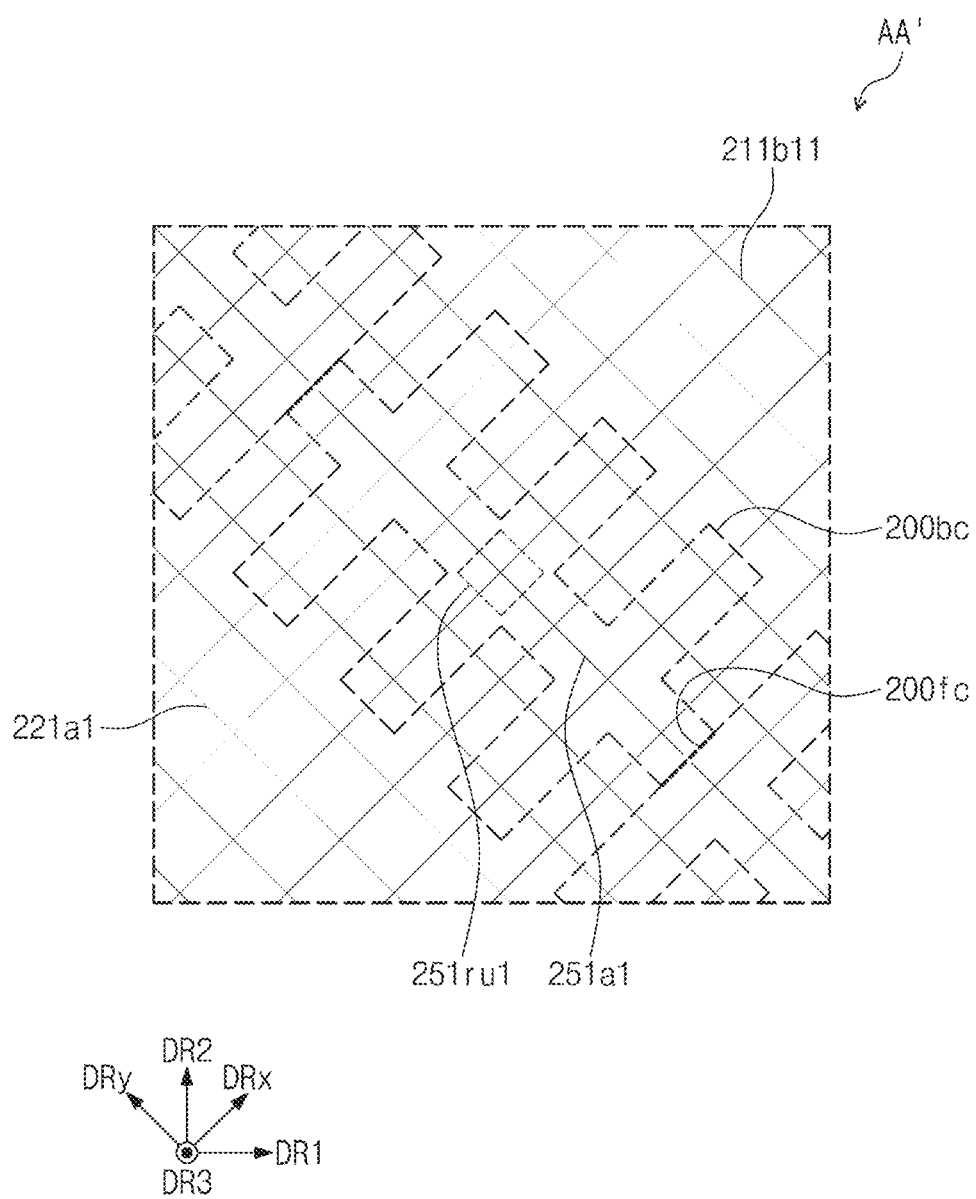
FIG. 8 is an enlarged view of the area AA' of FIG. 5 according to an example embodiment of the inventive concept.

FIG. 8 is an enlarged view of the area AA' of FIG. 5 according to an example embodiment of the inventive concept.

Referring to FIG. 8, a first pattern 251a1 may have a shape that is different from that of the first pattern 251a previously described with reference to FIG. 7A. The first pattern 251a1 may include first repeating units 251ru1.

Widths in the first crossing direction DRx within the first pattern 251a1 may be different from each other. For example, the first pattern 251a1 has a width defined by one first repeating unit 251ru1 in the first crossing direction DRx and a width defined by five first repeating units 251ru1 in the first crossing direction DRx. The one first repeating unit 251ru1 and the five first repeating units 251ru1 may be alternately arranged in the second crossing direction DRy.

In FIG. 8, the first repeating unit 251ru1 includes two mesh lines as an example. However, the inventive concept is not limited thereto. For example, the first repeating unit 251ru1 may include four mesh lines as illustrated in FIG. 6B.

Figure 9:
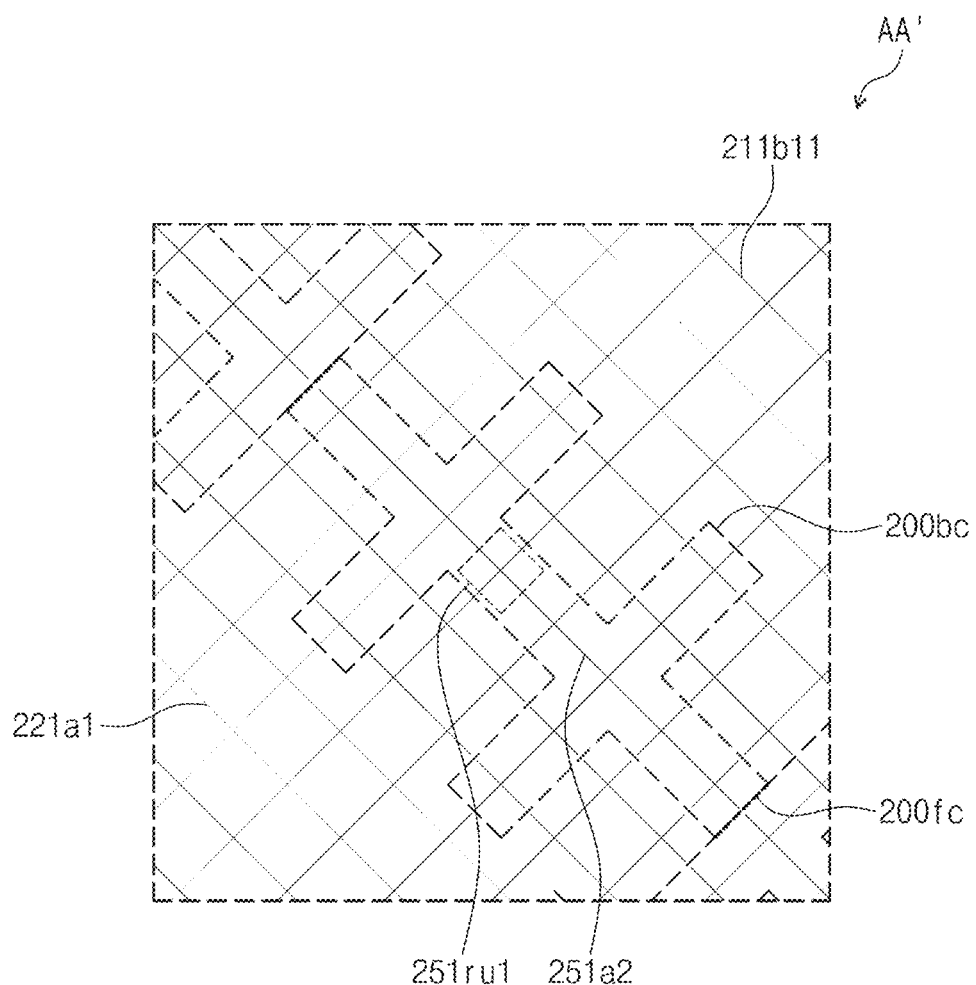
FIG. 9 is an enlarged view of the area AA' of FIG. 5 according to an example embodiment of the inventive concept.

FIG. 9 is an enlarged view of the area AA' of FIG. 5 according to an example embodiment of the inventive concept.

Referring to FIG. 9, a first pattern 251a2 may have a shape that is different from that of the first pattern 251a previously described with reference to FIG. 7A. The first pattern 251a2 may include first repeating units 251ru1.

Widths in the first crossing direction DRx within the first pattern 251a2 may be different from each other. For example, the first pattern 251a2 has a width defined by one first repeating unit 251ru1 in the first crossing direction DRx and a width defined by five first repeating units 251ru1 in the first crossing direction DRx. The one first repeating unit 251ru1 and the five first repeating units 251ru1 may be sequentially repeated in the second crossing direction DRy.

Figure 10:
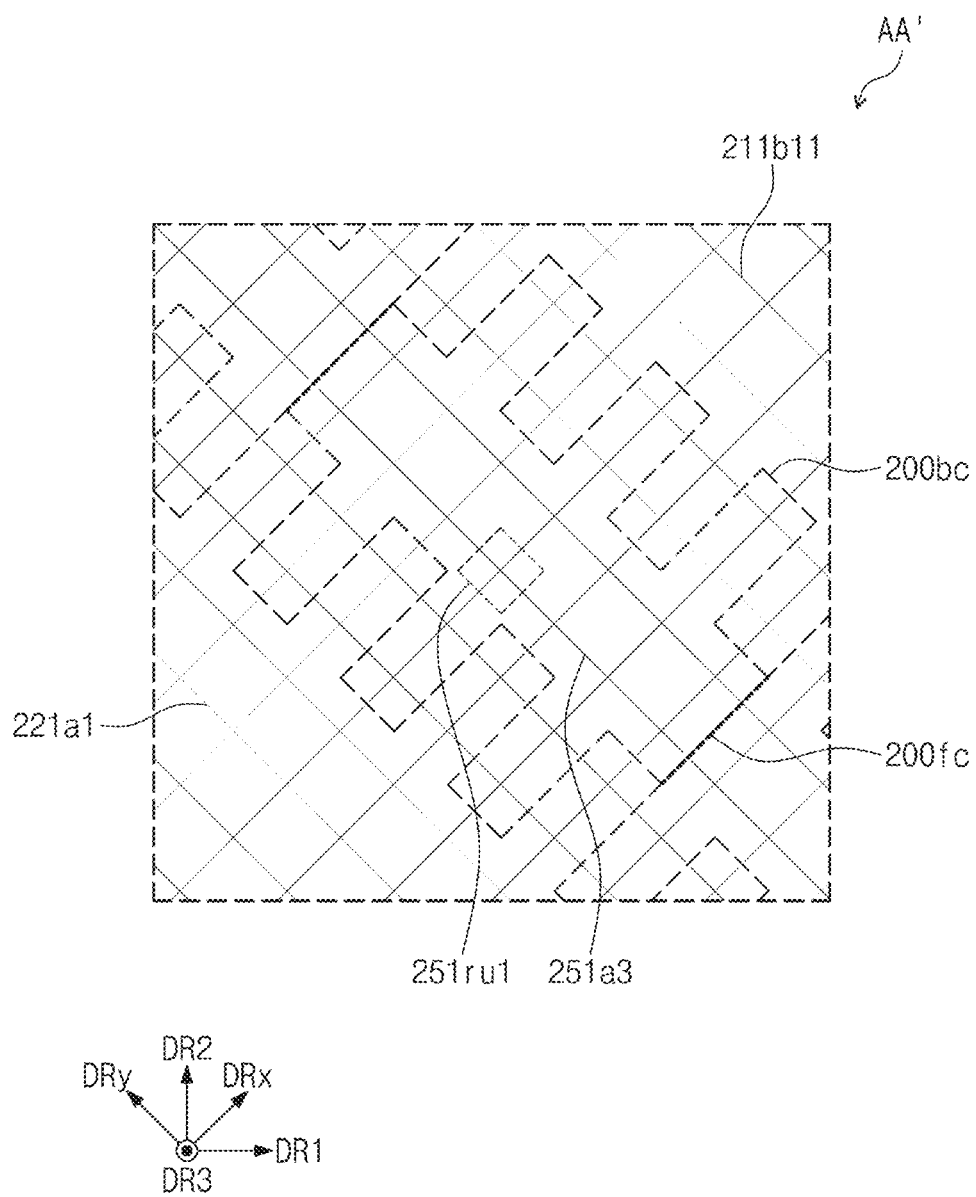
FIG. 10 is an enlarged view of the area AA' of FIG. 5 according to an example embodiment of the inventive concept.

FIG. 10 is an enlarged view of the area AA' of FIG. 5 according to an example embodiment of the inventive concept.

Referring to FIG. 10, a first pattern 251a3 may have a shape that is different from that of the first pattern 251a previously described with reference to FIG. 7A. The first pattern 251a3 may include first repeating units 251ru1. Widths in the first crossing direction DRx within the first pattern 251a3 may be different from each other. For example, the first pattern 251a3 has a width defined by two first repeating units 251ru1 in the first crossing direction DRx and a width defined by six first repeating units 251ru1 in the first crossing direction DRx. The two first repeating units 251ru1 and the six first repeating units 251ru1 may be alternately repeated in the second crossing direction DRy.

Figure 11:
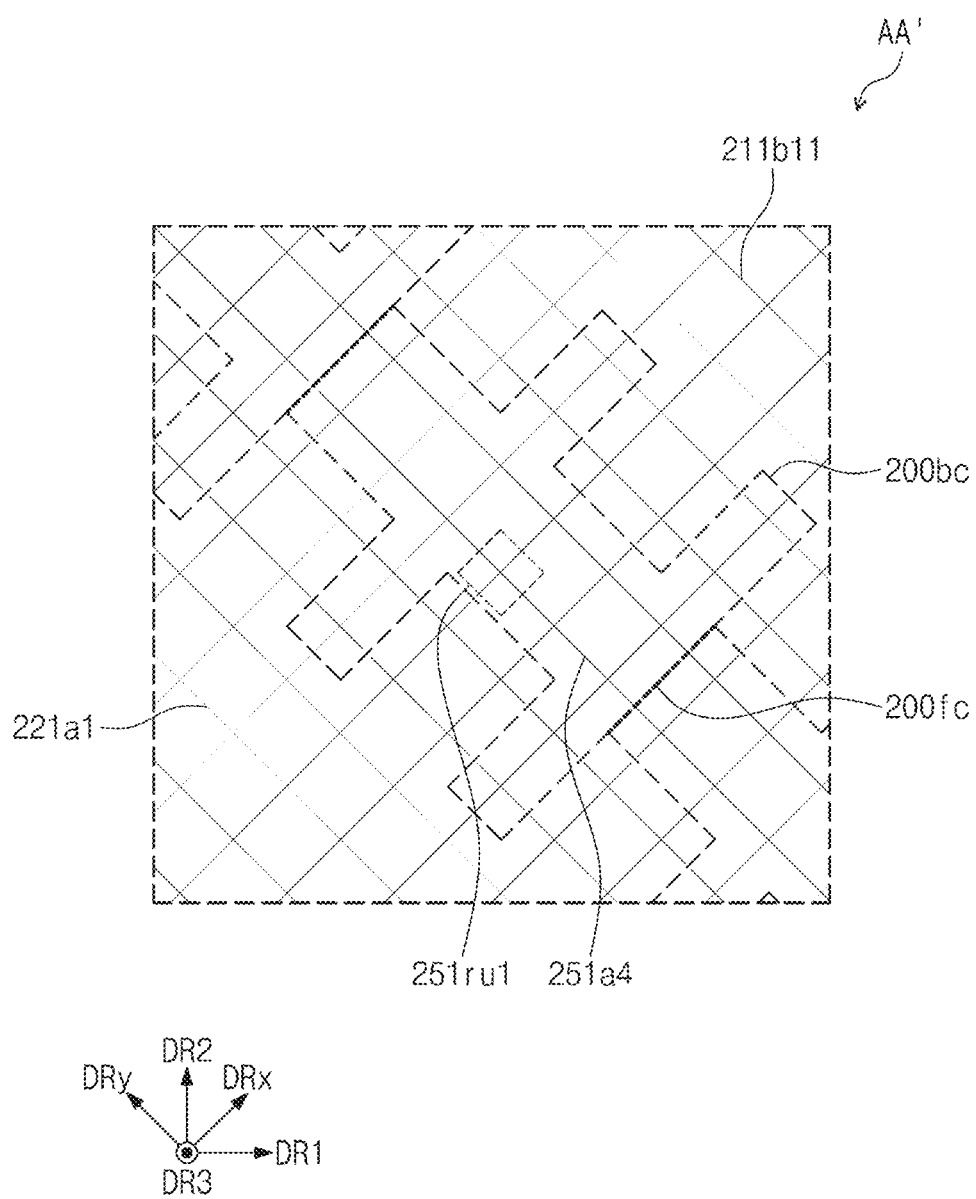
FIG. 11 is an enlarged view of the area AA' of FIG. 5 according to an example embodiment of the inventive concept.

FIG. 11 is an enlarged view of the area AA' of FIG. 5 according to an example embodiment of the inventive concept.

Referring to FIG. 11, a first pattern 251a4 may have a shape that is different from that of the first pattern 251a previously described with reference to FIG. 7A. The first pattern 251a4 may include first repeating units 251ru1. Widths in the first crossing direction DRx within the first pattern 251a4 may be different from each other. For example, the first pattern 251a4 has a width defined by two first repeating units 251ru1 in the first crossing direction DRx and a width defined by six first repeating units 251ru1 in the first crossing direction DRx. The two first repeating unit 251ru1 and the six first repeating units 251ru1 may be sequentially repeated in the second crossing direction DRy.

Figure 12:
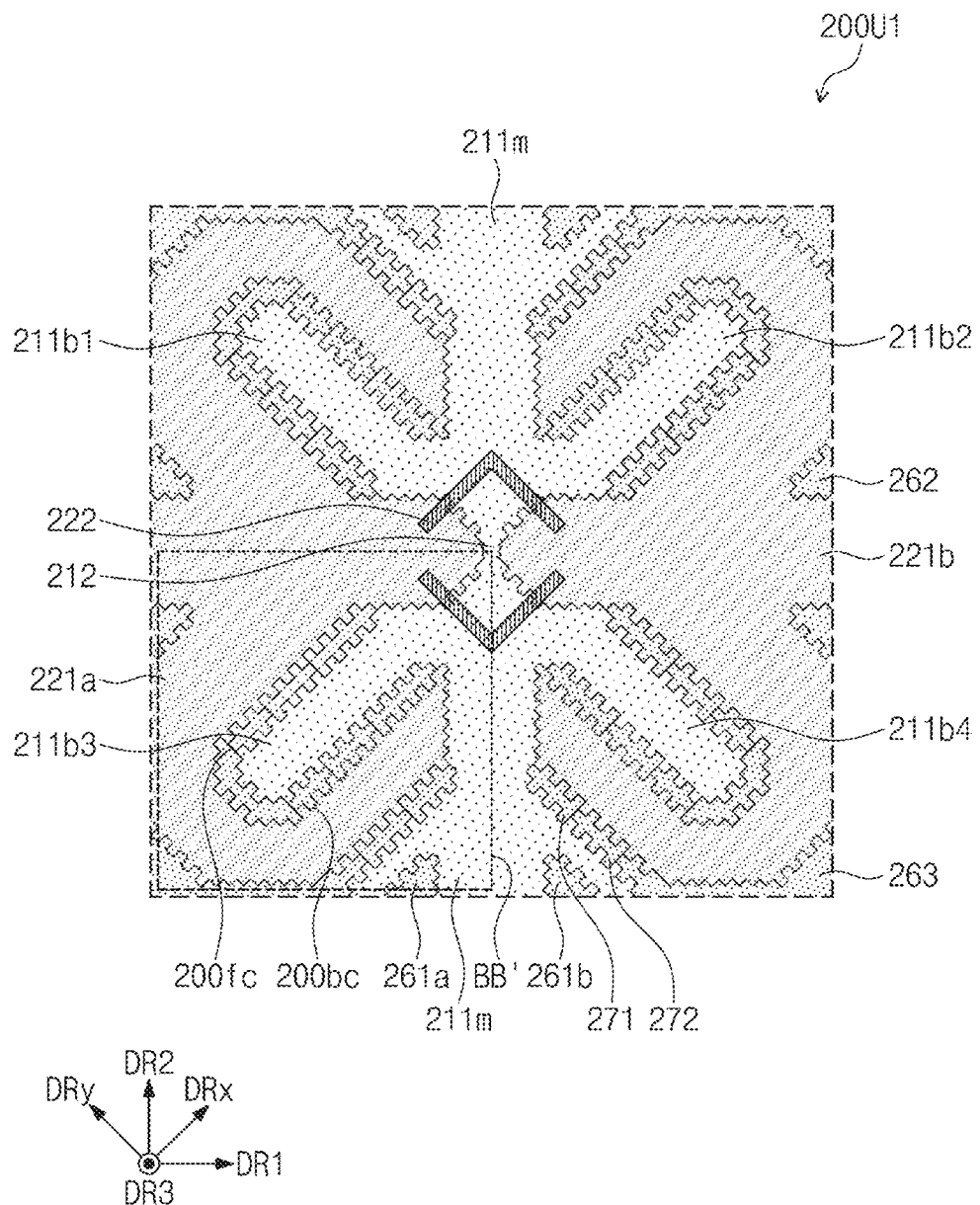
FIG. 12 is a plan view of one sensing unit according to an example embodiment of the inventive concept.
Figure 13:
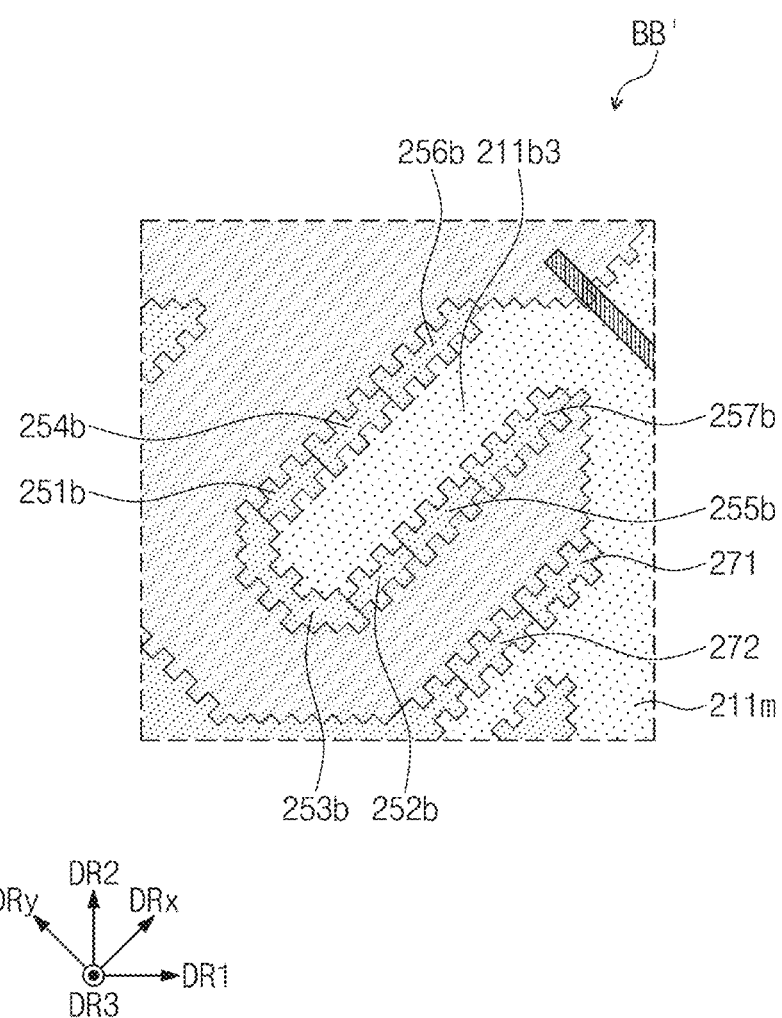
FIG. 13 is an enlarged view of an area BB' of FIG. 12 according to an example embodiment of the inventive concept.

FIG. 12 is a plan view of one sensing unit according to an example embodiment of the inventive concept. FIG. 13 is an enlarged view of an area BB' of FIG. 12 according to an example embodiment of the inventive concept.

FIG. 12 illustrates a sensing unit 200U1 having a shape different from that of the sensing unit 200U previously described with reference to FIG. 5.

For convenience of explanation, to the extent that a further description of elements and technical aspects is omitted, it may be assumed that these elements and technical aspects are at least similar to corresponding elements and technical aspects that have been described elsewhere in the present disclosure.

Referring to FIGS. 4, 12 and 13, the sensing unit 200U1 includes a portion of the first sensing electrode 210, a portion of the second sensing electrode 220, a plurality of patterns 251b, 252b, 253b, 254b, 255b, 256b, 257b, 271, and 272, first dummy patterns 261a and 261b, a second dummy pattern 262, and a third dummy pattern 263.

The plurality of patterns 251b, 252b, 253b, 254b, 255b, 256b, 257b, 271, and 272 may include first to seventh patterns 251b, 252b, 253b, 254b, 255b, 256b, and 257b and first and second additional patterns 271 and 272.

The first to seventh patterns 251b, 252b, 253b, 254b, 255b, 256b, and 257b may be disposed between the first branch portion 211b1 and the first sensing pattern 221a, between the second branch portion 211b2 and the second sensing pattern 221b, between the third branch portion 211b3 and the first sensing pattern 221a, and between the fourth branch portion 211b4 and the second sensing pattern 221b, respectively.

The first and second additional patterns 271 and 272 may be disposed between the extension portion 211m and the first sensing pattern 221a and between the extension portion 211m and the second sensing pattern 221b.

The first dummy patterns 261a and 261b may be provided as patterns defined in the first portion 211 and be surrounded by the extension portion 211m. The second dummy pattern 262 may be provided as a pattern defined in each of the first and second sensing patterns 221a and 221b and may be surrounded by the first and second sensing patterns 221a and 221b. The third dummy pattern 263 may be a pattern defined between two second sensing electrodes 220 adjacent to each other.

Each of the first to seventh patterns 251b, 252b, 253b, 254b, 255b, 256b, and 257b, each of the first and second additional patterns 271 and 272, each of the first dummy patterns 261a and 261b, the second dummy pattern 262, and the third dummy pattern 263 may be electrically floated patterns. When all of the first to seventh patterns 251b, 252b, 253b, 254b, 255b, 256b, and 257b, the first and second additional patterns 271 and 272, the first dummy patterns 261a and 261b, the second dummy pattern 262, and the third dummy pattern 263 are electrically floated, a mutual capacitance measured between one first sensing electrode 210 and one second sensing electrode 220, which cross each other in the sensing unit 200U1, may be a reference mutual capacitance.

Figure 14:
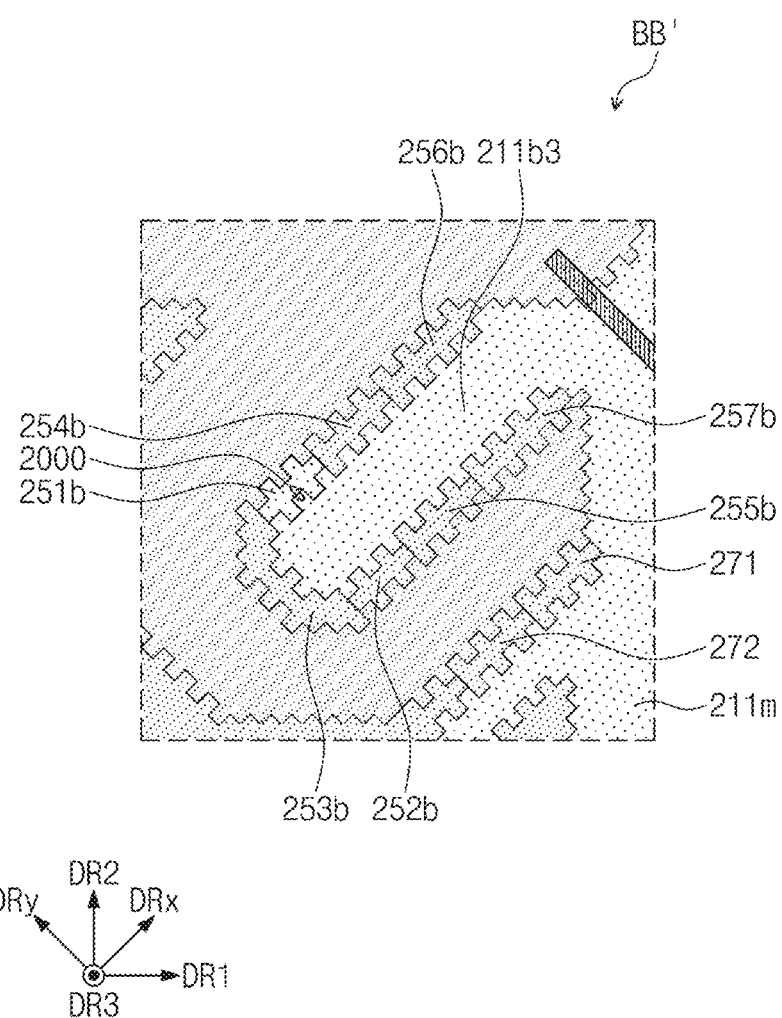
FIG. 14 is an enlarged view of the area BB' of FIG. 12 according to an example embodiment of the inventive concept.
Figure 15:
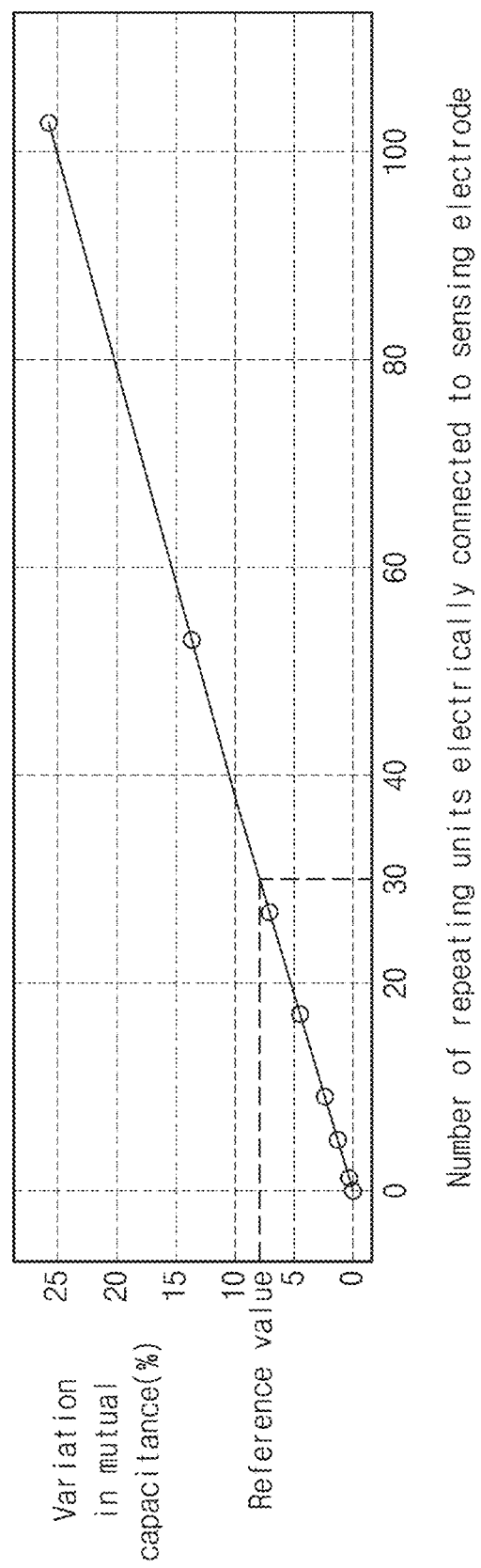
FIG. 15 is an exemplary graph illustrating a variation in mutual capacitance depending on the number of repeating units that are electrically connected to the sensing pattern.

FIG. 14 is an enlarged view of the area BB' of FIG. 12 according to an example embodiment of the inventive concept. FIG. 15 is an exemplary graph illustrating a variation in mutual capacitance depending on the number of repeating units that are electrically connected to the sensing electrode.

Referring to FIG. 14, the first pattern 251b and the third branch portion 211b3 may be electrically connected by foreign substances 2000. Thus, the first pattern 251b may function as a portion of the first sensing electrode 210 (see FIG. 4) that is not a floated pattern.

Referring to FIG. 15, a variation (%) in mutual capacitance may correspond to a value multiplied by 100 after dividing a difference between the measured mutual capacitance and the reference mutual capacitance described in FIG. 13 by the reference mutual capacitance.

Referring to FIGS. 14 and 15, the first pattern 251b having nine repeating units may be connected to the third branch portion 211b3 by the foreign substances 2000. In this case, the mutual capacitance measured between one first sensing electrode 210 and one second sensing electrode 220 may be about 432.85 picofarads. The reference mutual capacitance may be about 422.86 picofarads. When nine repeating units are electrically connected to the first sensing electrode 210, the variation (%) in mutual capacitance may be about 2.36%.

When the variation (%) in mutual capacitance exceeds the reference value, it may be determined as a non-uniform sensitivity defect. The reference value may be about 8%, but is not particularly limited thereto. When the number of repeating units connected to the first sensing electrode 210 is 30 or less, a condition of 8% or less may be satisfied. Therefore, the number of repeating units constituting one pattern may be determined to be 30 or less.

Figure 17:
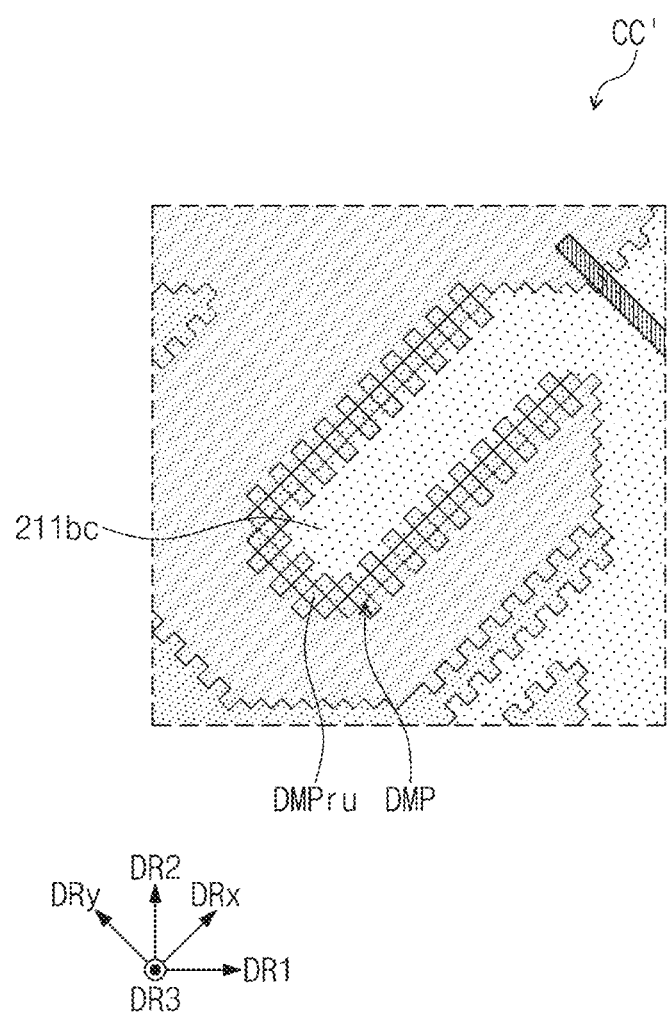
FIG. 17 is a plan view illustrating an area CC' of FIG. 16.

FIG. 16 is a photograph showing a portion of a sensor layer. FIG. 17 is a plan view illustrating an area CC' of FIG. 16.

FIG. 16 illustrates an image showing an area corresponding to nine sensing units 200Ucc. Referring to FIG. 16, patterns DMP surrounding a branch portion 211bc may appear dark and be visually recognized by a user.

Referring to FIG. 17, each of the patterns DMP may include only one repeating unit DMPru.

The one repeating unit DMPru may have the same shape as the first repeating unit 251ru described with reference to FIG. 6B or the first repeating unit 251ru1 described with reference to FIG. 7B.

When the one repeating unit DMPru is electrically connected to the branch portion 211bc, a mutual capacitance measured between one first sensing electrode 210 (see FIG. 4) and one second sensing electrode 220 (see FIG. 4) may be about 424.11 picofarads, and a variation in mutual capacitance compared to the reference mutual capacitance may be about 0.3% to realize sensing sensitivity similar to the reference sensing sensitivity.

However, referring to FIG. 16, since each of the patterns DMP includes only one repeating unit DMPru, a possibility that the patterns DMP are visually recognized may increase.

FIG. 18 is a photograph showing a portion of a sensor layer.

FIG. 18 illustrates an image showing an area corresponding to nine sensing units 200U. For example, FIG. 18 illustrates an image showing sensing units 200U in which each of patterns DMPx disposed in the first sensing electrode 210 (see FIG. 4) and the second sensing electrode 220 (see FIG. 4) includes nine or more repeating units.

The patterns DMPx may be patterns disposed between one branch portion 211b1 and one sensing pattern 221a, similar to the first to seventh patterns 251, 252, 253, 254, 255, 256, and 257 previously described with reference to FIG. 5.

When light incident from an external source of the electronic device 1000 (see FIG. 1) is incident into the portion at which the mesh lines are disposed and the portion at which the mesh lines are not disposed, amounts of light reflected may be different from each other. For example, when external light is incident into a space defined by the mesh lines, most of the external light may be reflected, and thus, patterns may be visually recognized relatively brightly by a user. Alternatively, when external light is incident into an empty space in which no mesh lines exist, reflectance of the external light may be relatively reduced, and thus, patterns may be visually recognized relatively darkly by a user.

Referring to FIGS. 16 and 17, each of the patterns DMP may include only one repeating unit DMPru. Thus, a portion of the mesh lines may be removed for each repeating unit DMPru. That is, the empty space in which the mesh lines do not exist may increase as the number of repeating units constituting each of the patterns DMP decreases. Thus, the patterns DMP may be more visually recognized, for example, may appear darker and clearer, than the patterns DMPx of FIG. 18.

According to an example embodiment of the inventive concept, the number of repeating units included in the patterns DMPx may be determined so that the patterns DMPx are not visually recognized by a user. For example, when the number of repeating units included in the patterns DMPx is 8 or less, the patterns DMPx may be visually recognized by a user. In this case, the number of repeating units included in the patterns DMPx may be provided to be 9 or more.

According to an example embodiment of the inventive concept, the plurality of patterns DMPx disposed between the first sensing electrode 210 (see FIG. 4) and the second sensing electrode 220 (see FIG. 4) may be electrically insulated from each other. In this case, even if some of the plurality of patterns DMPx are short-circuited to the first sensing electrode 210 (see FIG. 4) or the second sensing electrode 220 (see FIG. 4), the variation in mutual capacitance may be less than the predetermined level. Therefore, the defect rate of the sensor layer 200 (see FIG. 4) may be reduced, and the manufacturing yield of the electronic device 1000 (see FIG. 1) may be increased.

Also, each of the plurality of patterns DMPx may include the plurality of repeating units. Therefore, the probability that the plurality of patterns is visually recognized may be reduced by the difference in reflectance of the external light between the area in which the plurality of patterns is disposed and the area in which the first sensing electrode 210 (see FIG. 4) and the second sensing electrode 220 (see FIG. 4) are disposed.

As described above, according to example embodiments of the inventive concept, the plurality of patterns disposed between the first sensing electrode and the second sensing electrode may be electrically insulated from each other. In this case, even if some of the plurality of patterns are short-circuited to the first sensing electrode or the second sensing electrode, the variation in mutual capacitance compared to the reference mutual capacitance may be less than the predetermined level. Therefore, the defect rate of the sensor layer may be reduced, and accordingly, the manufacturing yield of the electronic device may be increased.

Also, according to example embodiments of the inventive concept, each of the plurality of patterns may include the plurality of repeating units. Therefore, the probability that the plurality of patterns is visually recognized may be reduced by the difference in reflectance of the external light between the area in which the plurality of patterns is disposed and the area in which the first sensing electrode and the second sensing electrode are disposed.

While the present inventive concept has been particularly shown and described with reference to the example embodiments thereof, it will be understood by those of ordinary skill in the art that various changes in form and detail may be made therein without departing from the spirit and scope of the present inventive concept as defined by the following claims.

What is claimed is:

1. An electronic device, comprising:
   a base layer;
   a first sensing electrode disposed on the base layer;
   a second sensing electrode disposed on the base layer;
   a first conductive pattern disposed on the base layer between a portion of the first sensing electrode and a portion of the second sensing electrode, and comprising a plurality of first repeating units electrically connected to each other; and
   a second conductive pattern disposed on the base layer between the portion of the first sensing electrode and the portion of the second sensing electrode, and comprising a plurality of second repeating units electrically connected to each other,
   wherein
   each of the plurality of first repeating units and the plurality of second repeating units comprises at least two mesh lines crossing each other,
   the first sensing electrode directly faces the first conductive pattern and the second conductive pattern with a first boundary interposed therebetween, the second sensing electrode directly faces the first conductive pattern and the second conductive pattern with a second boundary therebetween, an end of the first conductive pattern and an end of the second conductive pattern directly face each other with a third boundary connected to the first boundary and the second boundary therebetween, and the first sensing electrode, the second sensing electrode, the first conductive pattern, and the second conductive pattern are insulated by the first boundary, the second boundary, and the third boundary.

2. The electronic device of claim 1, wherein each of the plurality of first repeating units and the plurality of second repeating units comprises four mesh lines, and each of the plurality of first repeating units and the plurality of second repeating units comprises an opening defined by the four mesh lines.

3. The electronic device of claim 1, wherein each of a number of the plurality of first repeating units and a number of the plurality of second repeating units is equal to or greater than 9 and equal to or less than 30.

4. The electronic device of claim 1, wherein a number of the plurality of first repeating units and a number of the plurality of second repeating units are different from each other.

5. The electronic device of claim 1, wherein the first sensing electrode comprises a branch portion extending in a predetermined direction, and the portion of the second sensing electrode has the shape that surrounds a portion of the branch portion, and the first conductive pattern is disposed between the branch portion and the second sensing electrode, and the second conductive pattern is disposed between the branch portion and the second sensing electrode.

6. The electronic device of claim 5, further comprising:

a third conductive pattern disposed between the branch portion and the second sensing electrode and electrically insulated from the first conductive pattern and the second conductive pattern, wherein the third conductive pattern faces an end of the branch portion in an extension direction of the branch portion.

7. The electronic device of claim 1, wherein each of the first conductive pattern and the second conductive pattern is electrically floated.

8. The electronic device of claim 1, wherein a number of the plurality of first repeating units and a number of the plurality of second repeating units are the same as each other.

9. The electronic device of claim 1, wherein each of the first sensing electrode and the second sensing electrode has a mesh structure.

10. The electronic device of claim 1, further comprising: a display layer disposed below the base layer and to provide an image.

11. An electronic device, comprising:

a display layer comprising an emission area; and a sensor layer disposed on the display layer, wherein a sensing area and a peripheral area are defined on the sensor layer, and the sensor layer comprises a plurality of sensing units disposed in the sensing area, wherein each of the plurality of sensing units comprises a portion of a first sensing electrode, a portion of a second sensing electrode, and a plurality of conductive patterns disposed between the portion of the first sensing electrode and the portion of the second sensing electrode, the portion of the first sensing electrode comprises a plurality of branch portions, the portion of the second sensing electrode comprises a plurality of sensing patterns spaced apart from each other with the first sensing electrode disposed therebetween, and a bridge pattern connecting the plurality of sensing patterns to each other, the plurality of conductive patterns comprises a first conductive pattern disposed between one branch portion of the plurality of branch portions and one sensing pattern of the plurality of sensing patterns, and a second conductive pattern disposed between the one branch portion and the one sensing pattern and electrically insulated from the first conductive pattern, the one branch portion directly faces the first conductive pattern and the second conductive pattern with a first boundary interposed therebetween, the one sensing pattern directly faces the first conductive pattern and the second conductive pattern with a second boundary therebetween, and an end of the first conductive pattern and an end of the second conductive pattern directly face each other with a third boundary connected to the first boundary and the second boundary therebetween, and the one branch portion, the one sensing pattern, the first conductive pattern, and the second conductive pattern are insulated by the first boundary, the second boundary, and the third boundary.

12. The electronic device of claim 11, wherein the first conductive pattern comprises a plurality of first repeating units, and the second conductive pattern comprises a plurality of second repeating units, and each of the plurality of first repeating units has substantially the same shape as each of the plurality of second repeating units.

13. The electronic device of claim 12, wherein each of the plurality of first repeating units and each of the plurality of second repeating units comprises at least two mesh lines crossing each other.

14. The electronic device of claim 12, wherein each of the plurality of first repeating units and each of the plurality of second repeating units comprises four mesh lines defining one opening.

15. The electronic device of claim 12, wherein a number of the plurality of first repeating units and a number of the plurality of second repeating units are different from each other.

16. The electronic device of claim 12, wherein each of a number of the plurality of first repeating units and a number of the plurality of second repeating units is equal to or greater than 9 and equal to or less than 30.

17. The electronic device of claim 12, wherein a number of the plurality of first repeating units and a number of the plurality of second repeating units are the same as each other.

18. The electronic device of claim 11, wherein each of the plurality of conductive patterns is electrically floated.

19. The electronic device of claim 18, wherein the plurality of conductive patterns comprises a third conductive pattern disposed between the one branch portion and the one sensing pattern and electrically insulated from the first conductive pattern and the second conductive pattern, wherein the third conductive pattern faces an end of the one branch portion in an extension direction of the one branch portion.

20. The electronic device of claim 11, wherein each of the first sensing electrode, the second sensing electrode, and the plurality of conductive patterns has a mesh shape.

21. The electronic device of claim 11, wherein the sensor layer further comprises:
a cover insulating layer covering the first sensing electrode, the second sensing electrode, and the plurality of conductive patterns,
wherein an opening is defined in a portion of the cover insulating layer which overlaps the emission area.

22. The electronic device of claim 21, further comprising:
a functional layer disposed on the sensor layer,
wherein a portion of the functional layer is filled into the opening defined by the cover insulating layer, and
the functional layer has a refractive index greater than that of the cover insulating layer.

\* \* \* \* \*